United States Patent
Park

(10) Patent No.: US 8,916,105 B2
(45) Date of Patent: Dec. 23, 2014

(54) MULTI-STACK CURE SYSTEM AND METHOD OF OPERATING THE SAME

(71) Applicant: Samsung Electronics Co., Ltd., Suwon-si, Gyeonggi-do (KR)

(72) Inventor: Jung-Gyu Park, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 185 days.

(21) Appl. No.: 13/759,672

(22) Filed: Feb. 5, 2013

(65) Prior Publication Data

US 2013/0287633 A1  Oct. 31, 2013

(30) Foreign Application Priority Data

Apr. 30, 2012 (KR) .................. 10-2012-0045695

(51) Int. Cl.
*B01J 19/00* (2006.01)
*H01L 21/677* (2006.01)
(Continued)

(52) U.S. Cl.
CPC ........... *B01J 19/00* (2013.01); *H01L 21/67109* (2013.01); *H01L 21/67173* (2013.01); *H01L 21/67294* (2013.01); *H01L 21/67706* (2013.01); *H01L 21/67742* (2013.01); *H01L 21/67757* (2013.01)
USPC ............................ 422/198; 422/129; 422/187

(58) Field of Classification Search
CPC .......... B01J 19/00; B01J 19/24; B01J 19/245; B01J 19/248; B01J 19/2485; B01J 19/249; B05D 3/00; B05D 3/02; B05D 3/0209; B05D 3/04; B05D 3/0433; B05D 3/046; B05D 3/06; B05D 3/061; B05D 3/065; B05D 3/067; B05D 3/10; B05D 3/107; B05D 3/108; B05D 3/14; B05D 3/141; B05D 3/145; B05D 3/147; H01L 2224/00; H01L 2224/01; H01L 2224/02; H01L 2224/03; H01L 2224/035; H01L 2224/03515; H01L 2224/10; H01L 2224/11; H01L 2224/115; H01L 2224/11515; H01L 2224/26; H01L 2224/27; H01L 2224/275; H01L 2224/27515
USPC .......................................... 422/129, 187, 198
See application file for complete search history.

(56) References Cited

FOREIGN PATENT DOCUMENTS

JP        2704343         10/1997
KR    1020050035355      4/2005
(Continued)

OTHER PUBLICATIONS

Machine translation of JP 2704343A, published on Oct. 9, 1997 and provided in the IDS filed Feb. 5, 2013.*

(Continued)

*Primary Examiner* — Natasha Young
(74) *Attorney, Agent, or Firm* — Onello & Mello, LLP

(57) ABSTRACT

Provided is a multi-stack cure system. The system includes a chamber having an inlet port and an outlet port. A magazine is mounted in the chamber. A plurality of substrates having encapsulants are loaded in the magazine. A heater is mounted at the chamber and serves to heat the plurality of substrates having the encapsulants. A loading unit is positioned adjacent the inlet port. The loading unit has a transfer device and a push bar. A substrate recognition device is mounted in the loading unit. A control device is connected to the substrate recognition device. The inlet port has a size larger than each of the plurality of substrates having the encapsulants and smaller than the magazine.

20 Claims, 29 Drawing Sheets

(51) Int. Cl.
*B01J 19/24* (2006.01)
*B05D 3/00* (2006.01)
*B05D 3/02* (2006.01)
*B05D 3/04* (2006.01)
*B05D 3/06* (2006.01)
*B05D 3/10* (2006.01)
*B05D 3/14* (2006.01)
*H01L 21/67* (2006.01)

(56) References Cited

FOREIGN PATENT DOCUMENTS

| KR | 1020080017811 | 2/2008 |
| KR | 10-0848283 | 7/2008 |
| KR | 10-0851243 | 8/2008 |
| KR | 1020090048233 | 5/2009 |

OTHER PUBLICATIONS

Machine translation of KR 10-848283A, published Jul. 18, 2008 and provided in the IDS filed Feb. 5, 2013.*
Machine translation of KR 10-0851243A, published Aug. 4, 2008 and provided in the IDS filed Feb. 5, 2013.*
Machine translation of KR 1020050035355 A, published on Apr. 18, 2005 and provided in the IDS filed Feb. 5, 2013.*
Machine translation of KR 1020080017811A, published Feb. 27, 2008 and provided in the IDS filed Feb. 5, 2013.*
Machine translation of KR 1020090048233A, published May 13, 2009 and provided in the IDS filed Feb. 5, 2013.*

* cited by examiner

MULTI-STACK CURE SYSTEM AND METHOD OF OPERATING THE SAME

CROSS-REFERENCE TO RELATED APPLICATION

This application claims priority under 35 U.S.C. §119 to Korean Patent Application No. 10-2012-45695 filed on Apr. 30, 2012, the disclosure of which is hereby incorporated by reference in its entirety.

BACKGROUND

1. Field

Embodiments of the inventive concept relate to a multi-stack cure system and method for fabricating semiconductor devices.

2. Description of Related Art

Research has been conducted for determining approaches for curing an encapsulant molded on a printed circuit board (PCB) during a semiconductor fabrication process.

SUMMARY

Embodiments of the inventive concepts provide a cure system and method of operating a cure system, which may cure products having different cure limit times in one chamber.

Aspects of the inventive concepts should not be limited by the above description, and other unmentioned aspects will be clearly understood by one of ordinary skill in the art from example embodiments described herein.

In accordance with an aspect of the inventive concept, a multi-stack cure system is provided. The system includes a chamber having an inlet port and an outlet port and a magazine in the chamber. A plurality of substrates having encapsulants is loaded into the magazine. A heater is mounted at the chamber. The heater is constructed and arranged to heat the plurality of substrates having the encapsulants. A loading unit is adjacent to the inlet port and having a transfer device and a push bar. A substrate recognition device is at the loading unit. A control device is coupled to the substrate recognition device. The inlet port has a size larger than each of the plurality of substrates having the encapsulants and smaller than the magazine.

In an embodiment, the magazine includes a plurality of loading grooves constructed and arranged to load the plurality of substrates having the encapsulants. A thickness of the push bar is smaller than a pitch of the loading grooves.

In an embodiment, the loading unit further comprises a plate and a rail formed on the plate. The transfer device comprises a first transfer device coupled to the plate and a second transfer device between the first transfer device and the inlet port and configured to horizontally move along the rail.

In an embodiment, the substrate recognition device is mounted on the first transfer device.

In an embodiment, each of the first and second transfer devices includes a plurality of pinch rollers constructed and arranged to transfer one substrate of the plurality of substrates having the encapsulants at a time.

In an embodiment, the substrate recognition device includes a quick response (QR) code scanner, a 2-dimensional (2D) bar code scanner, or a bar code scanner.

In an embodiment, each of the plurality of substrate having the encapsulants includes an identification (ID) code, wherein the ID code is a QR code, a 2D bar code, or a bar code.

In an embodiment, the system further comprises an unloading unit adjacent the outlet port and having a third transfer device and a puller.

In an embodiment, the puller includes a gripper having a size permitting the gripper to grip one selected of the plurality of substrates having the encapsulants.

In accordance with another aspect of the inventive concepts, a multi-stack cure system is provided. The system includes a chamber having an inlet port and an outlet port. A magazine is in the chamber. A plurality of substrates having encapsulants is loaded in the magazine. A heater is mounted at the chamber. The heater is constructed and arranged heat the plurality of substrates having the encapsulants. An unloading unit is adjacent to the outlet port. The unloading unit has a first transfer device and a gripper. A substrate recognition device is at the unloading unit. A control device is coupled to the substrate recognition device. The outlet port has a size larger than each of the plurality of substrates having the encapsulants and smaller than the magazine.

In an embodiment, the gripper has such a size permitting the gripper to grip one selected of the plurality of substrates having the encapsulants.

In an embodiment, the unloading unit further comprises: a plate and a rail formed on the plate. The transfer device moves horizontally along the rail.

In an embodiment, the transfer device of the unloading unit includes a plurality of pinch rollers constructed and arranged to transfer one substrate of the plurality of substrates having the encapsulants at a time.

In an embodiment, the system further comprises a loading unit adjacent the inlet port and having a second transfer device and a pusher.

In an embodiment, the pusher includes a push bar configured to push one substrate of the plurality of substrates having the encapsulants at a time.

In accordance with another aspect of the inventive concepts, a multi-stack cure system is provided. The multi-stack cure system includes a loading zone; an unloading zone; and a cure zone including a chamber. The chamber has a plurality of inlet ports and a plurality of outlet ports. A magazine is positioned in the chamber. The magazine is constructed and arranged to receive a plurality of substrates having encapsulants transferred from the loading zone to the chamber via the inlet ports. The encapsulants of the substrates have different cure limit times. A substrate of the plurality of substrates has an encapsulant having an elapsed cure time. The substrate is aligned with an outlet port of the plurality of outlet ports for output to the unloading zone.

In an embodiment, the inlet ports and the outlet ports have a dimension that is greater than the plurality of substrates having the encapsulants and smaller than the magazine.

In an embodiment, the system further comprises a heater at the chamber, the heater constructed and arranged to heat the plurality of substrates having the encapsulants.

In an embodiment, the loading zone includes a loading unit, the loading unit having a transfer device and a push bar, wherein the magazine includes a plurality of loading grooves constructed and arranged to load the plurality of substrates, and wherein a thickness of the push bar is smaller than a pitch of the loading grooves.

In an embodiment, the system further comprises a substrate recognition device at the loading unit. The substrate recognition device includes a quick response (QR) code scanner, a 2-dimensional (2D) bar code scanner, or a bar code scanner. Each of the plurality of substrates includes an identification (ID) code. The ID code is a QR code, a 2D bar code, or a bar code.

Specific particulars of other embodiments are included in detailed descriptions and drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
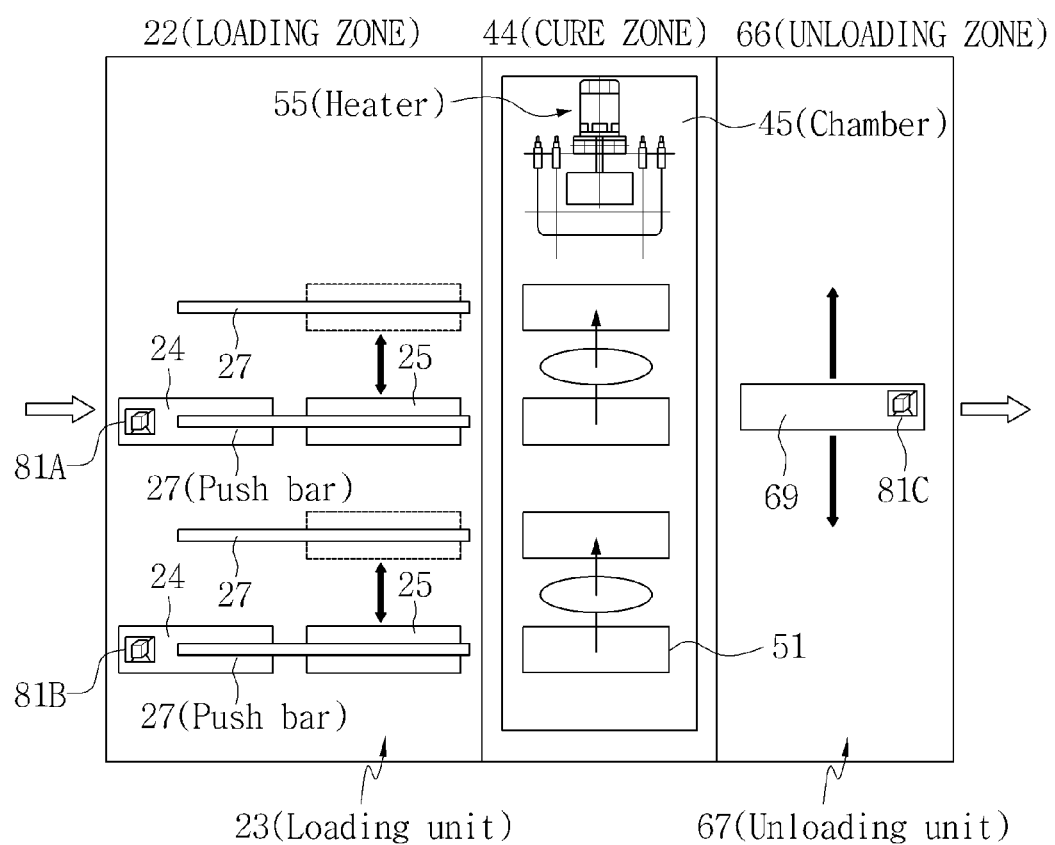
FIG. 1 is a system block diagram of a multi-stack cure system according to an embodiment of the inventive concepts.

Various embodiments will now be described more fully with reference to the accompanying drawings in which some embodiments are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art. In the drawings, the thicknesses of layers and regions may be exaggerated for clarity. It will also be understood that when a layer is referred to as being "on" another layer or substrate, it can be directly on the other layer or substrate or intervening layers may also be present. Like numbers refer to like elements throughout.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Terms that describe spatial relationships, such as "top end", "bottom end", "top surface", "bottom surface", "upper", "lower", and the like, may be used herein for ease of description to describe one element or feature's relationship to another element(s) or feature(s) as illustrated in the figures. It will be understood that such terms are intended to encompass different orientations of the device in use or operation in addition to the orientation(s) depicted in the figures. For example, if the device in the figures is turned over, elements described as "below" or "beneath" other elements or features would then be oriented "above" the other elements or features. Thus, the term "below" can encompass both an orientation of above and below. The orientation of the device may be changed in other ways (e.g., rotated 90 degrees or some other angle) and spatial relationships described herein should be interpreted within the context of the changed orientation.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 2:
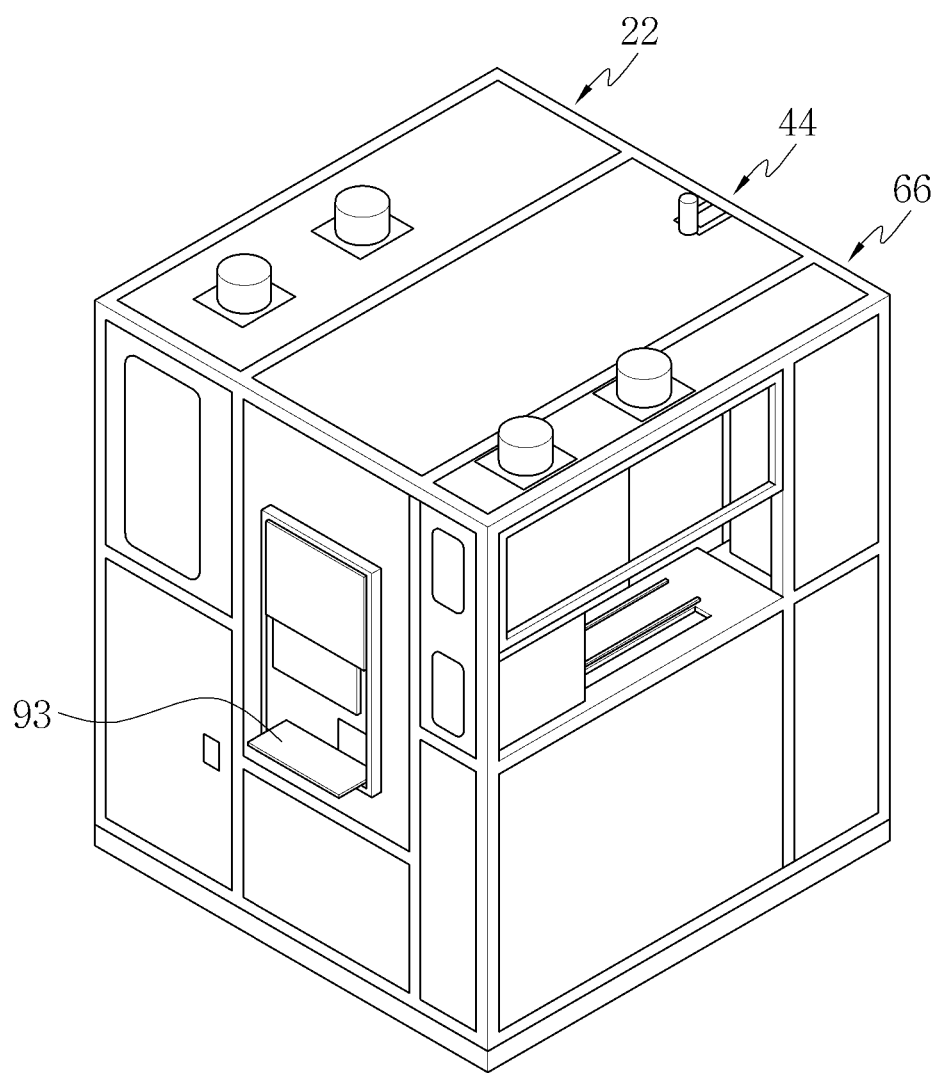
FIGS. 2 and 3 are a perspective view and front view, respectively, of the multi-stack cure system of FIG. 1.
Figure 3:
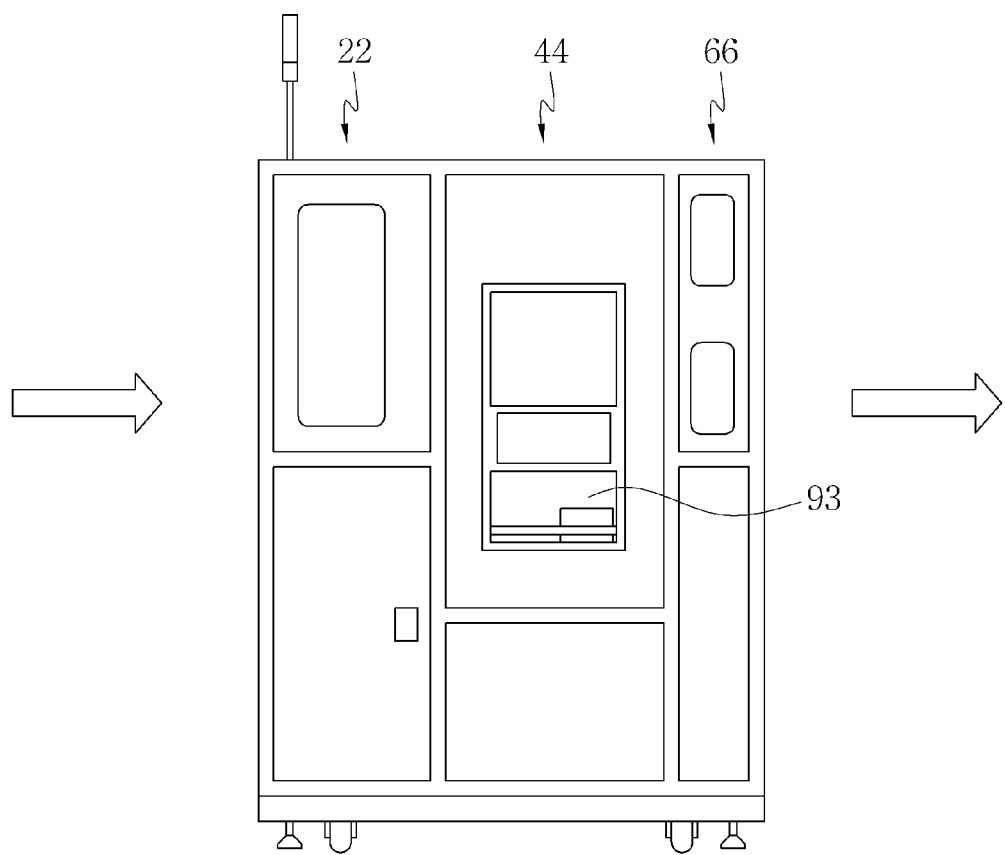
Figure 4:
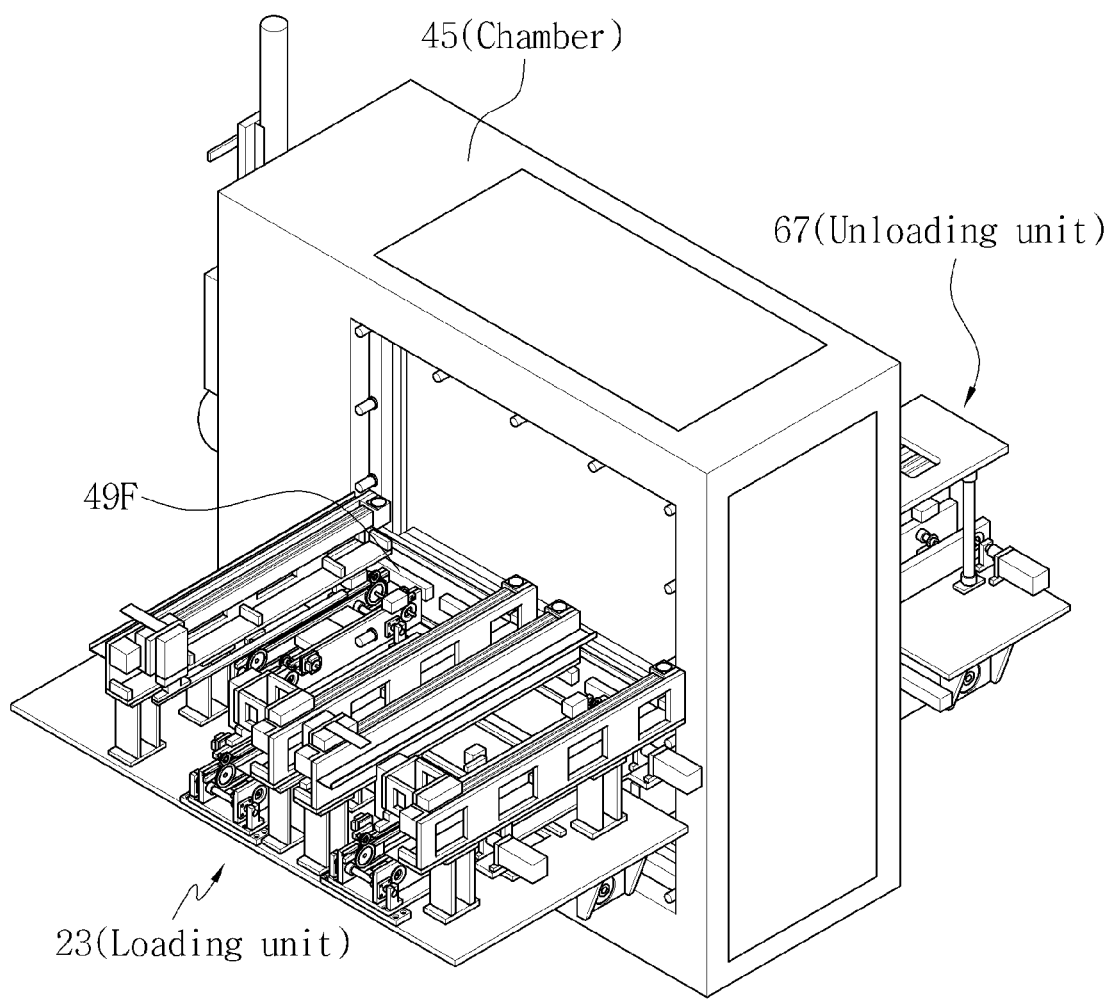
FIG. 4 is a perspective view of a multi-stack cure system according to an embodiment of the inventive concept, as viewed from a loading unit of the multi-stack cure system.
Figure 5:
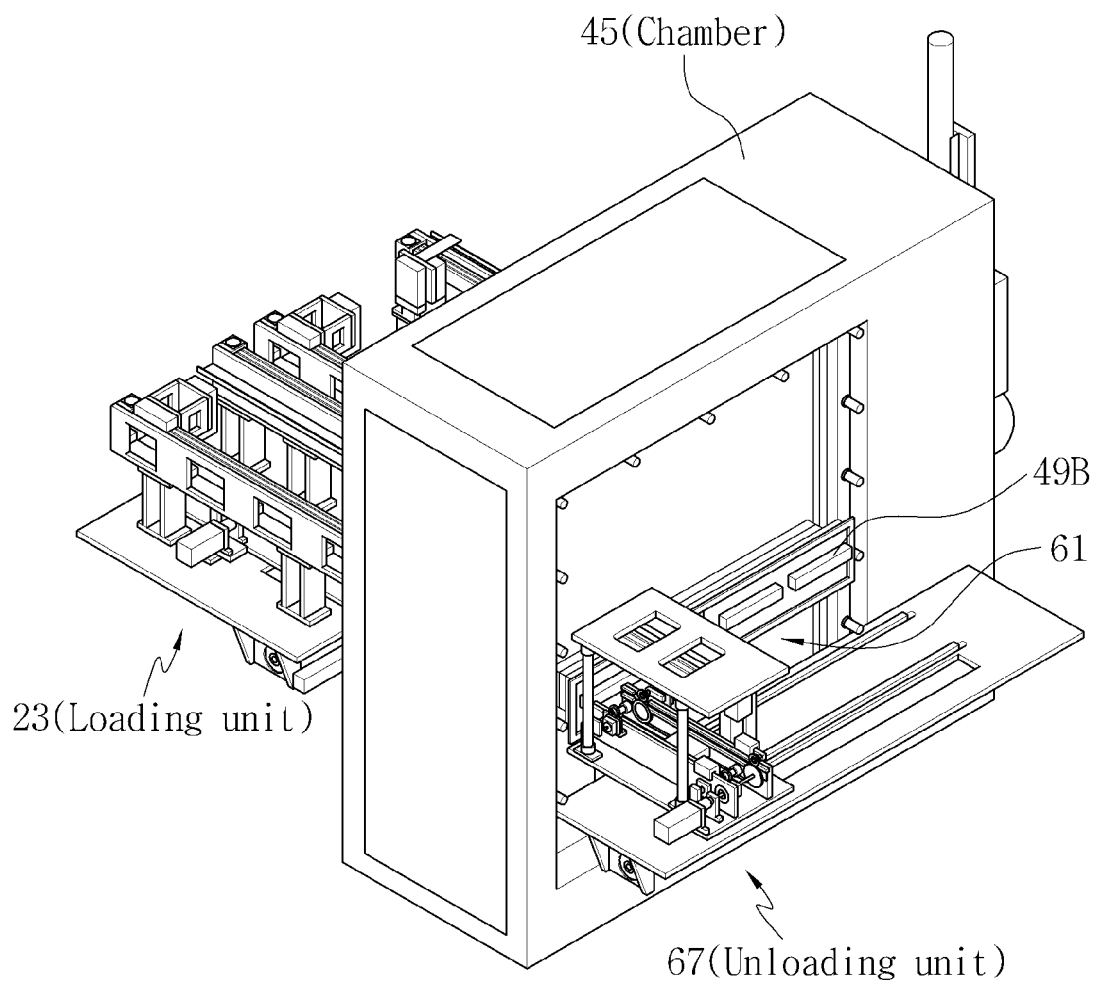
FIG. 5 is a perspective view of the multi-stack cure system viewed from the unloading unit of FIG. 4.

FIG. 1 is a system block diagram of a multi-stack cure system according to an embodiment of the inventive concepts. FIGS. 2 and 3 are a perspective view and front view, respectively, of the multi-stack cure system of FIG. 1. FIG. 4 is a perspective view of a multi-stack cure system according to an embodiment of the inventive concept, as viewed from a loading unit of the multi-stack cure system. FIG. 5 is a perspective view of the multi-stack cure system as viewed from the unloading unit of FIG. 4.

Referring to FIG. 1, the multi-stack cure system may include a loading zone 22, a cure zone 44, and an unloading zone 66. The cure zone 44 may be positioned between the loading zone 22 and the unloading zone 66. A loading unit 23 may be mounted at the loading zone 22. The loading unit 23 may include first transfer devices 24, second transfer devices 25, and push bars 27. Each of the first transfer devices 24 may be a fixed transfer device. The first transfer devices 24 may be parallel to one another. Each of the second transfer devices 25 may be a variable transfer device. Each of the second transfer devices 25 may be serially adjacent to a first transfer device 24. Each of the second transfer devices 25 may move horizontally in the loading zone 22. First and second substrate recognition devices 81A and 81B may be coupled to the first transfer devices 24.

The cure zone 44 may include a chamber 45, a heater 55, and one or more magazines 51. Each magazine 51 may vertically move in the chamber 45. The heater 55 may be mounted at the chamber 45 and heat the inside of the chamber 45. An unloading unit 67 may be mounted in the unloading zone 66. The unloading unit 67 may include third transfer devices 69. The third transfer devices 69 may horizontally move in the unloading zone 66. A third substrate recognition device 81C may be adhered to the third transfer device 69. The first through third substrate recognition devices 81A, 81B, and 81C may be quick response (QR) code scanners, 2-dimensional (2D) bar code scanners, or bar code scanners.

Referring to FIGS. 2 and 3, the loading zone 22, the cure zone 44, and the unloading zone unloading zone 66 may be integrally configured. A control device 93 may be mounted on one surface of the cure zone 44. The control device 93 may include an information management system (IMS) server. In another embodiment, the control device 93 may be connected to an external host computer. In another embodiment, the control device 93 is coupled to and/or in communication with any or all of the first, second, and third substrate recognition devices 81A, 81B, and 81C.

Referring to FIGS. 4 and 5, the loading unit 23 may be aligned with one surface of the chamber 45. A first air curtain 49F may be formed on one surface of the chamber 45. The unloading unit 67 may be aligned with another surface of the chamber 45. A second air curtain 49B and an outlet port 61 may be formed on another surface of the chamber 45.

Figure 6:
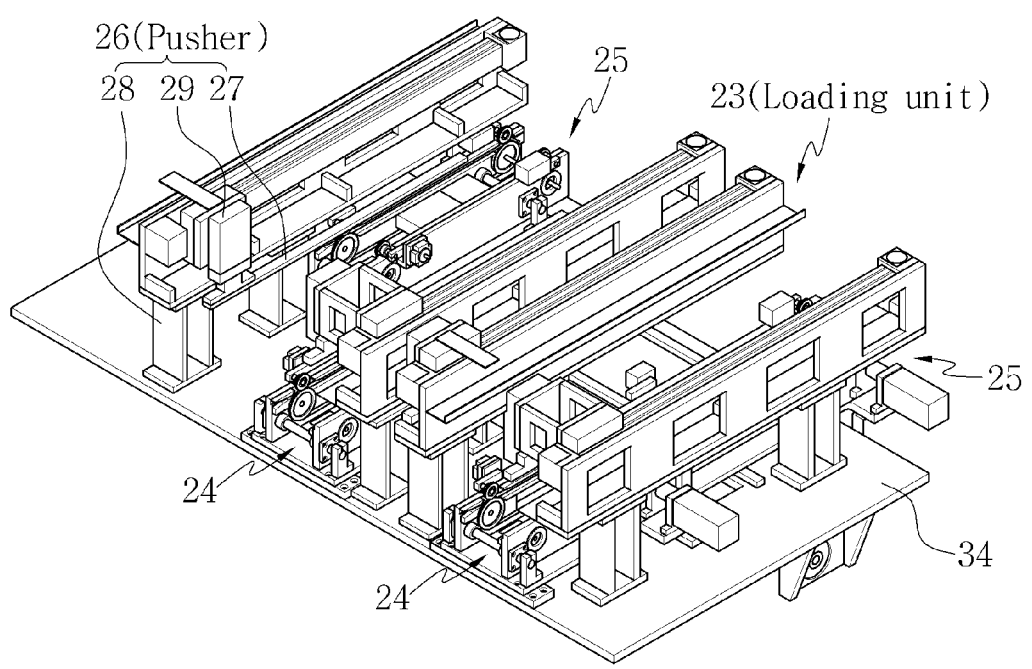
FIG. 6 is a perspective view of the loading unit of the multi-stack cure system of FIG. 1.
Figure 7:
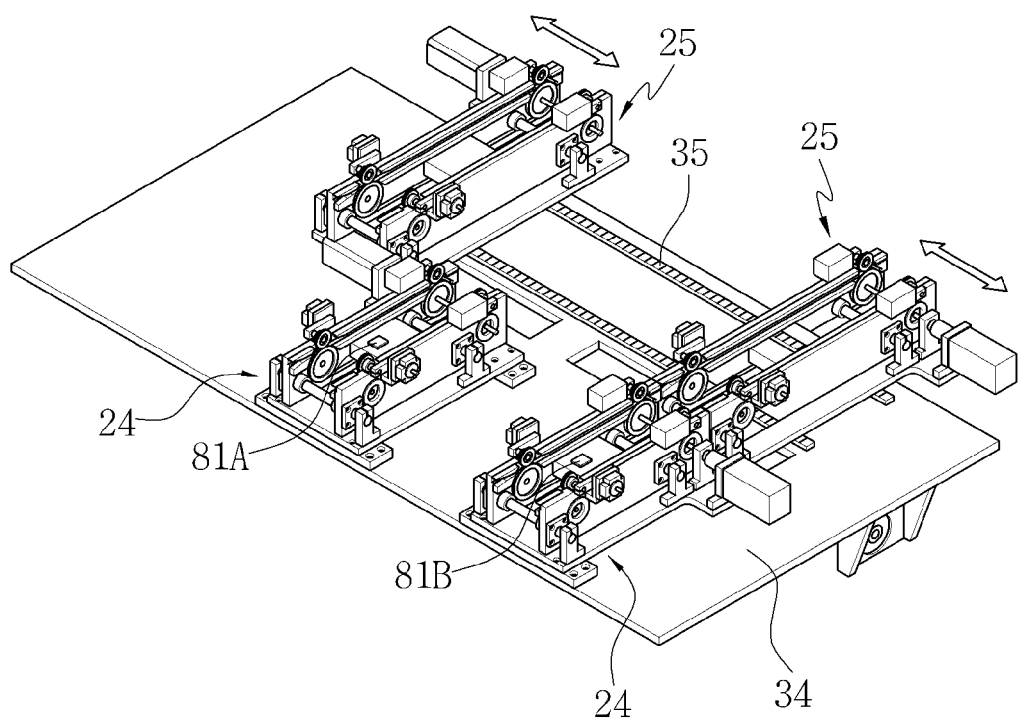
FIG. 7 is a perspective view of first and second transfer devices of the loading unit of FIG. 6.
Figure 8:
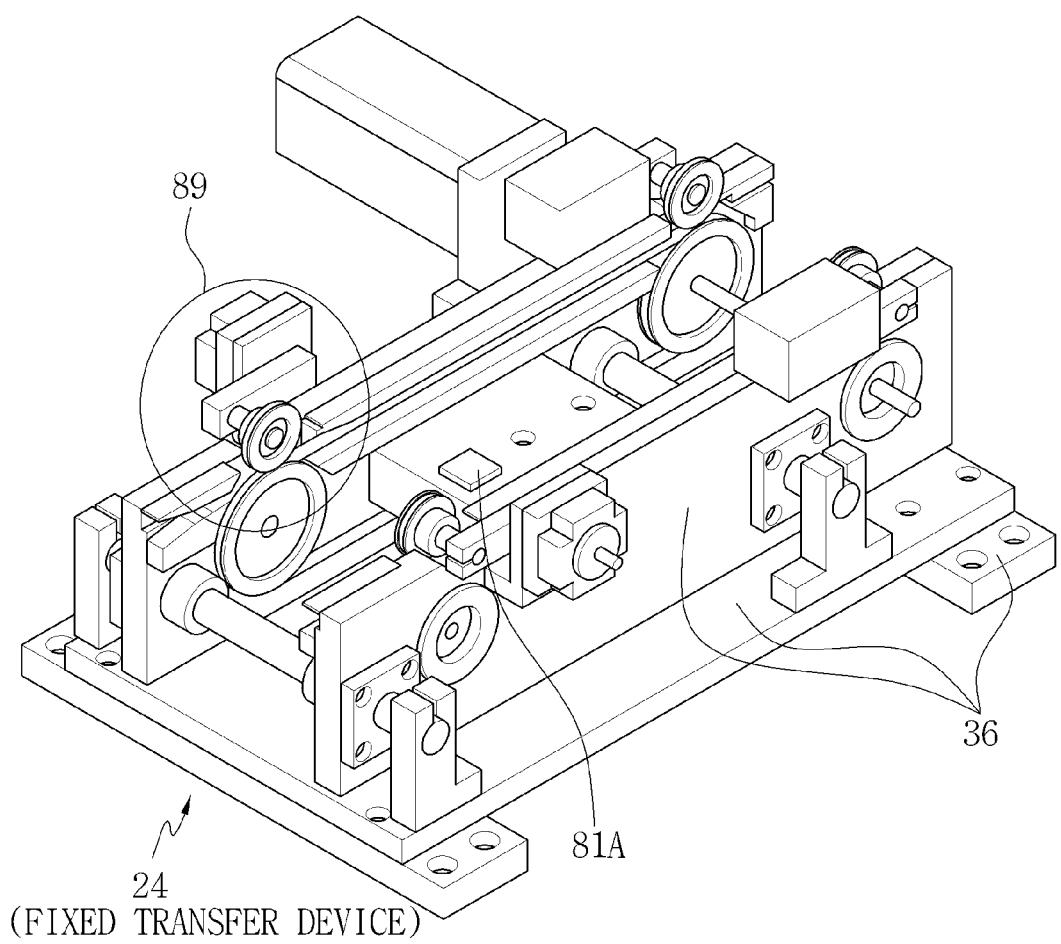
FIG. 8 is a perspective view of the first transfer device of the loading unit of FIG. 6.
Figure 9:
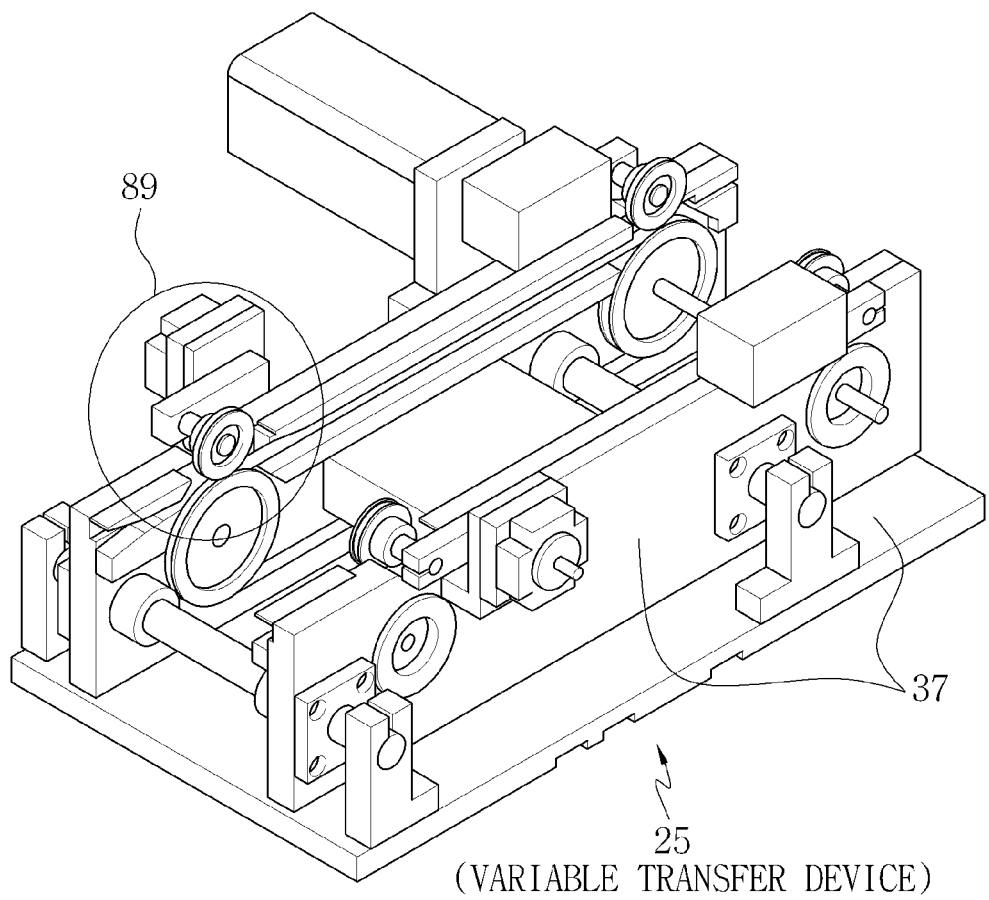
FIG. 9 is a perspective view of the second transfer device of the loading unit of FIG. 6.

FIG. 6 is a perspective view of the loading unit 23 of the multi-stack cure system of FIG. 1. FIG. 7 is a perspective view of first and second transfer devices 24, 25 of the loading unit 23 of FIG. 6. FIG. 8 is a perspective view of the first transfer device 24 of the loading unit 23 of FIG. 6, and FIG. 9 is a perspective view of the second transfer device 25 of the loading unit 23 of FIG. 6.

Referring to FIG. 6, the loading unit 23 may include the first transfer devices 24, the second transfer devices 25, and one or more pushers 26, which are mounted on a first plate 34. Each of the pushers 26 may include the push bar 27, a first bracket 28, and a first up-down unit up-down unit 29.

Referring to FIG. 7, a first rail 35 may be formed on the first plate 34. The first transfer devices 24 and the second transfer devices 25 may be mounted on the first plate 34. The first transfer devices 24 may be positioned parallel to one another. Each of the second transfer devices 25 may be serially adjacent to a first transfer device 24. Each of the second transfer devices 25 may move along the first rail 35, for example, in a horizontal direction. The first and second substrate recognition devices 81A and 81B may be coupled to the first transfer devices 24.

Referring to FIG. 8, each of the first transfer devices 24 may include a second bracket 36 and a plurality of pinch rollers 89 mounted on the second bracket 36. The second bracket 36 may be coupled to the first plate 34.

Referring to FIG. 9, each of the second transfer devices 25 may include a third bracket 37 and a plurality of pinch rollers 89 mounted on the third bracket 37. The third bracket 37 may be interlocked with the first rail 35 may move horizontally along the first plate 34, for example, in a horizontal direction.

Figure 10:
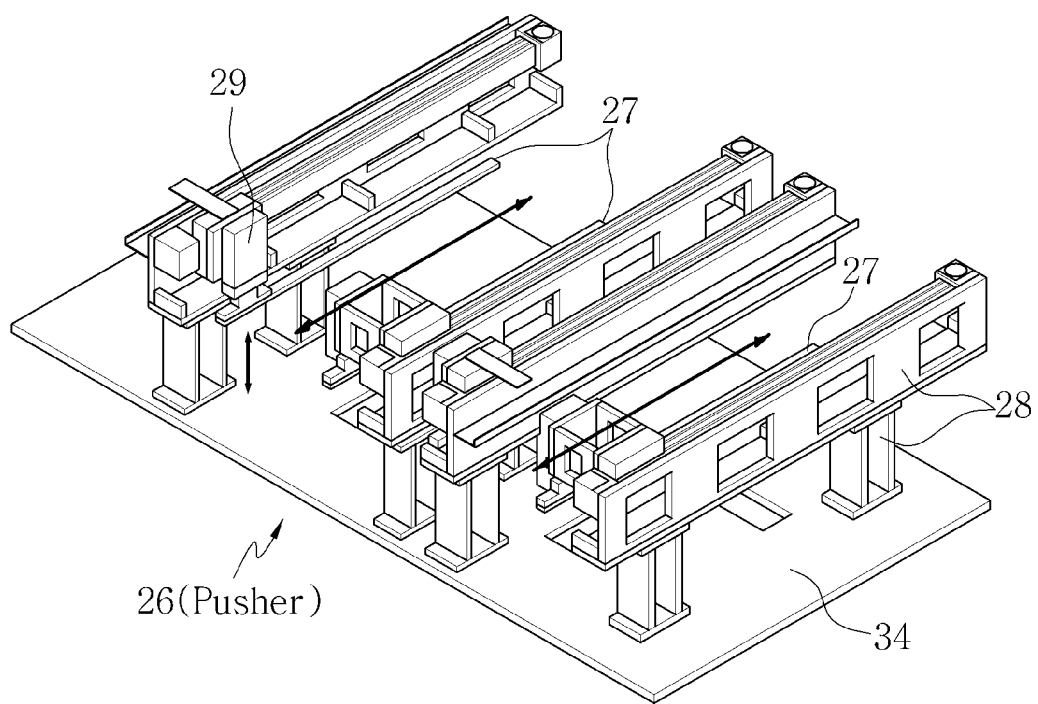
FIG. 10 is a perspective view of the pusher of the loading unit of FIG. 6.
Figure 11:
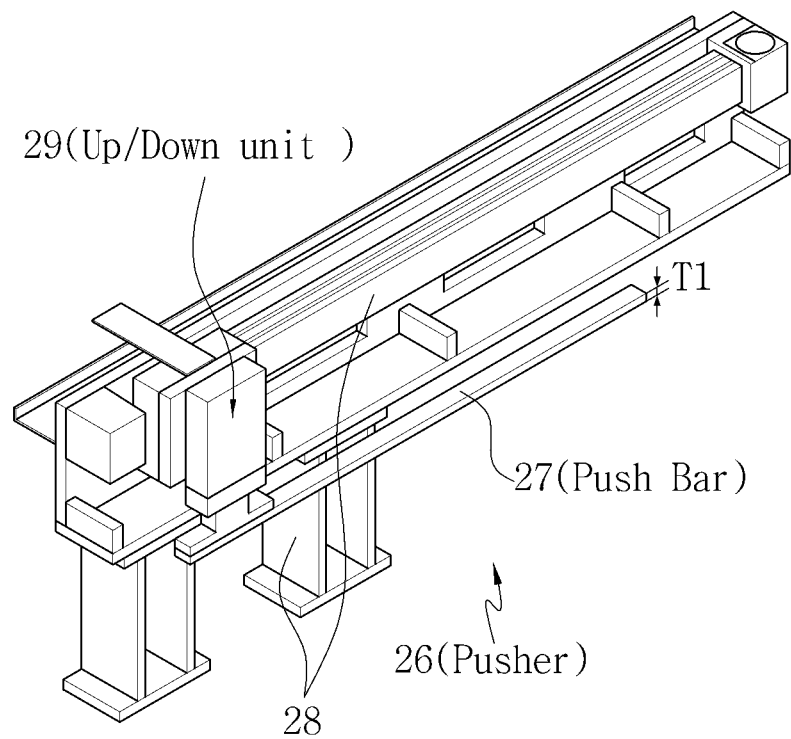
FIGS. 11 through 13 are perspective views illustrating operations of the pusher of FIG. 10.
Figure 12:
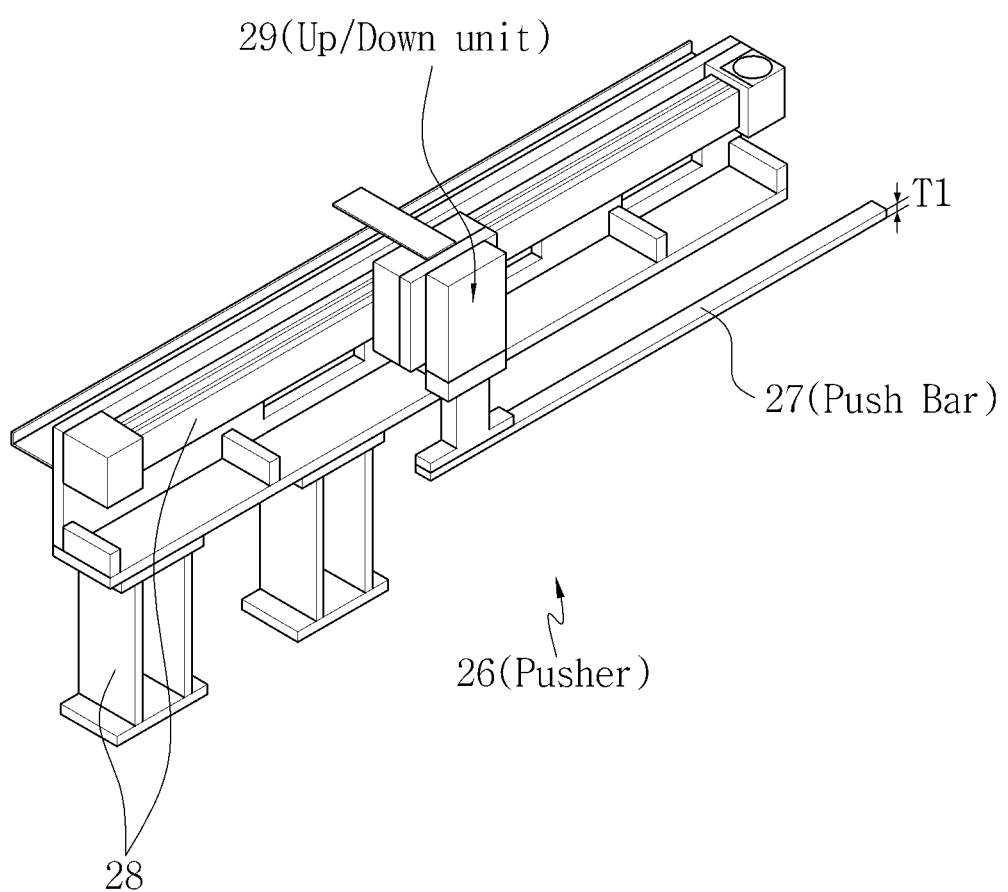
Figure 13:
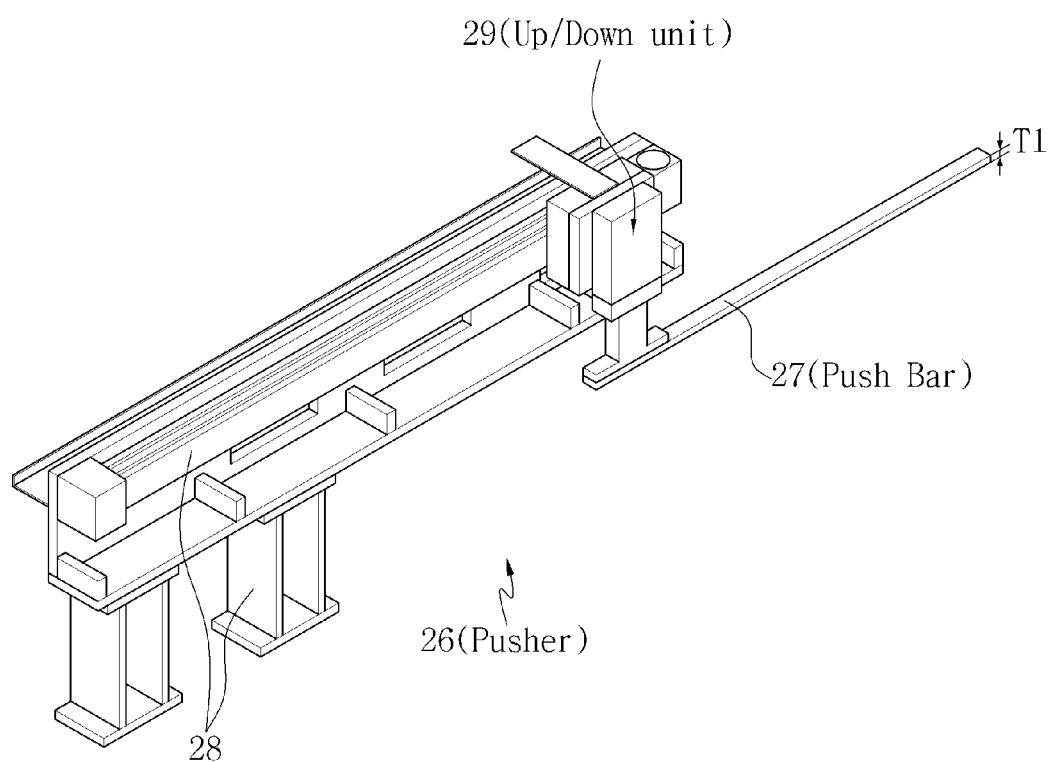

FIG. 10 is a perspective view of the pusher 26 of the loading unit 23 of FIG. 6. FIGS. 11 through 13 are perspective views illustrating operations of the pusher 26 of FIG. 10.

Referring to FIG. 10, the pushers 26 may be mounted on the first plate 34 parallel to one another. Each of the pushers 26 may include the push bar 27, the first bracket 28, and the first up-down unit up-down unit 29. The push bar 27 may move in a vertical direction using the first up-down unit 29. The push bar 27 and the first up-down unit 29 may move in a horizontal direction along the first bracket 28.

Referring to FIG. 11, the push bar 27 may have a first thickness T1. The first up-down unit 29 may control a vertical position of the push bar 27. The push bar 27 may be at a top end region of the first bracket 28 when in a standby mode. The push bar 27 may be behind the first bracket 28 when in the standby mode.

Referring to FIG. 12, the push bar 27 may descend using the first up-down unit 29 in a first operation mode. The first operation mode may be a loading operation. The push bar 27 and the first up-down unit 29 may move in a horizontal direction to the middle of the first bracket 28 in the first operation mode. Here, the push bar 27 may protrude over the first bracket 28.

Referring to FIG. 13, the push bar 27 may descend using the first up-down unit 28 in a second operation mode. The second operation mode may be an unloading operation. A vertical position of the push bar 27 in the second operation mode may be the same or similar to that when in the first operation mode. The push bar 27 and the first up-down unit 29 may move horizontally to the front of the first bracket 28 in the second operation mode. The push bar 27 may protrude from the end of the pusher 26 more than the first bracket 28. A horizontal position of the push bar 27 in the second operation mode may extend further, for example, in a horizontal direction, than in the first operation mode.

Figure 14:
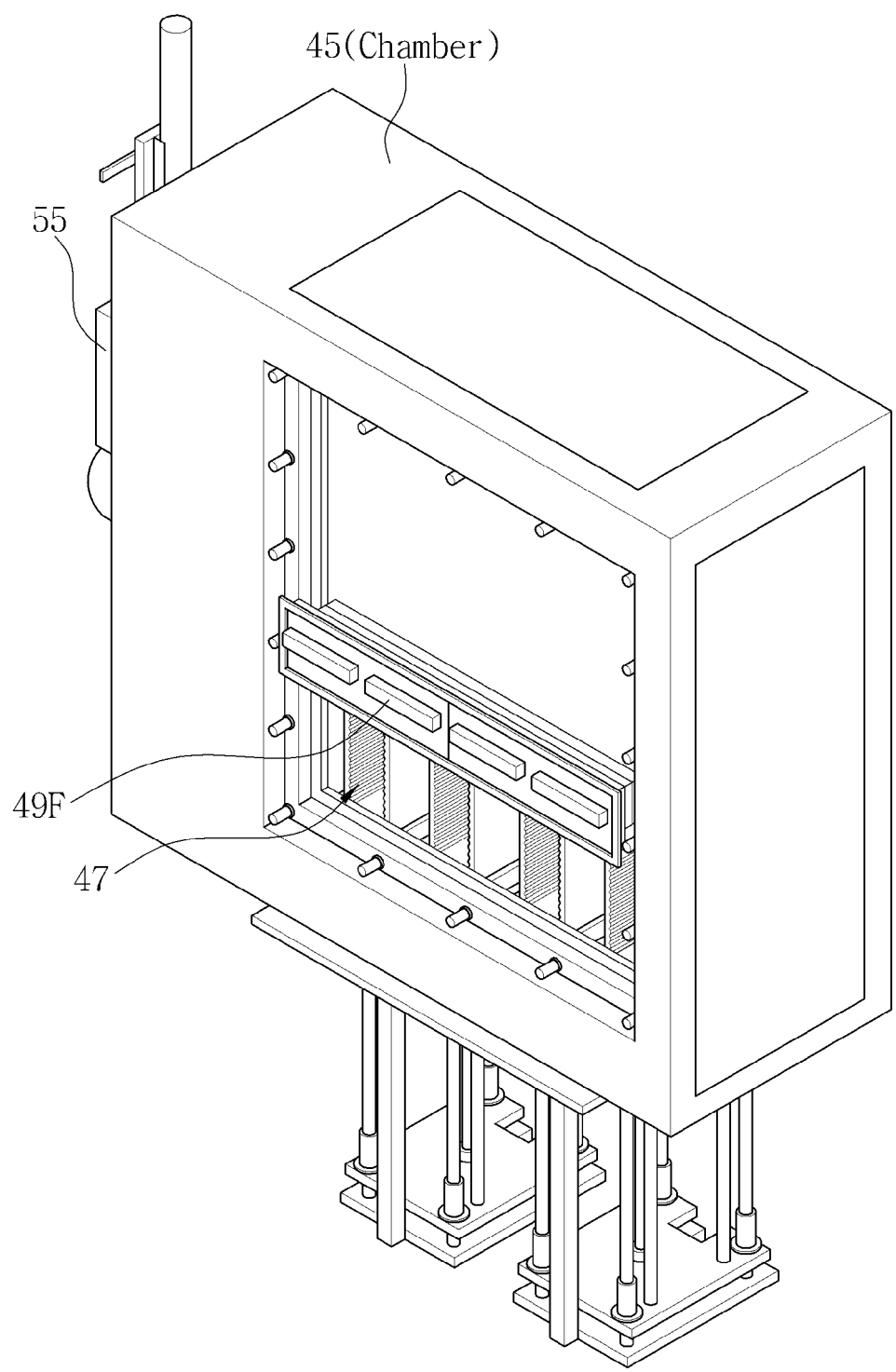
FIG. 14 is a perspective view of the chamber of the multi-stack cure system of FIG. 1.
Figure 15:
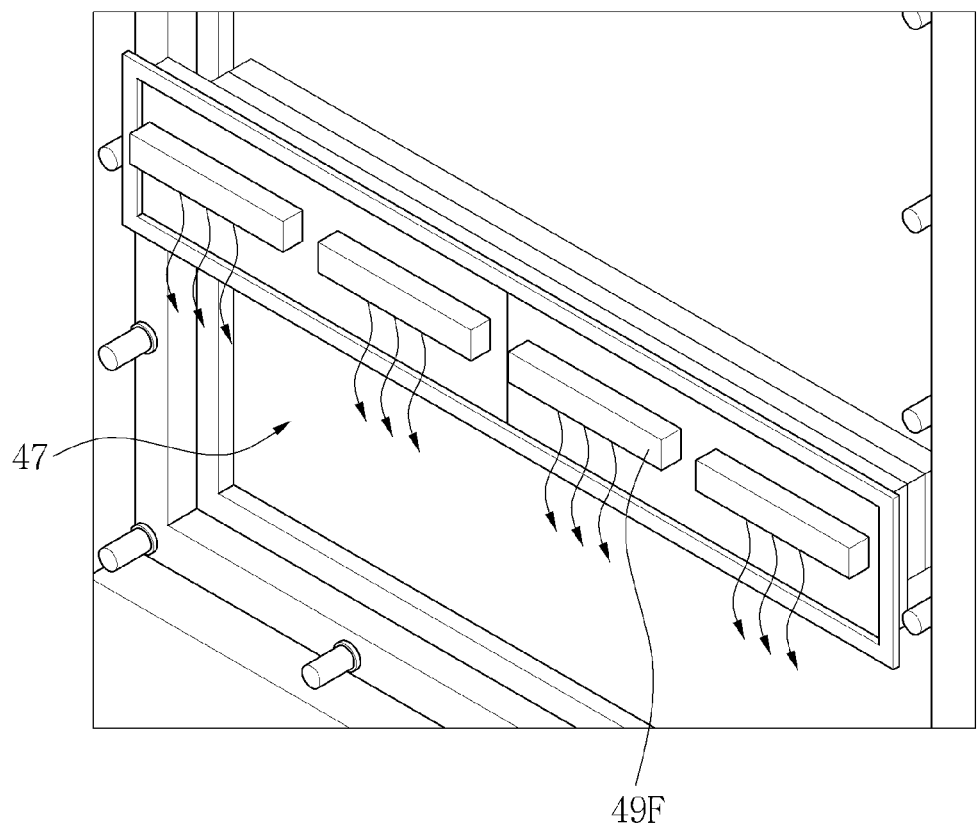
FIGS. 15 and 16 are perspective views of inlet ports of the chamber of FIG. 14.
Figure 16:
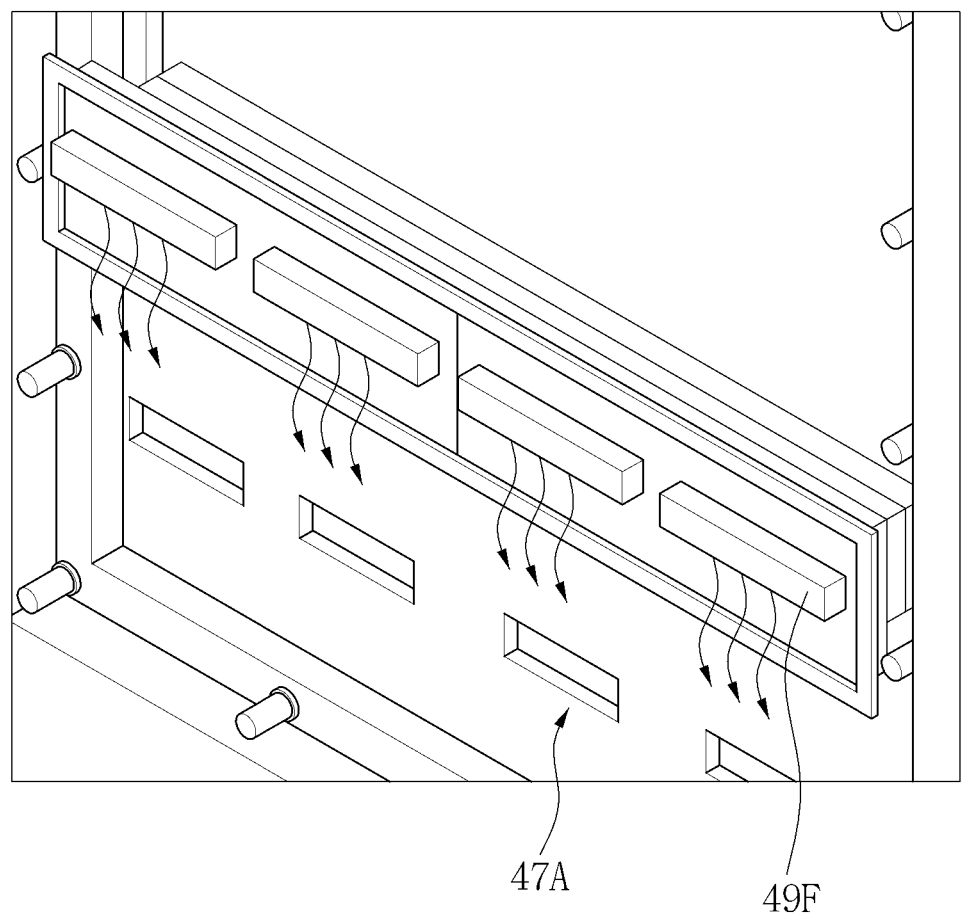

FIG. 14 is a perspective view of the chamber 45 of the multi-stack cure system of FIG. 1. FIGS. 15 and 16 are perspective views of inlet ports of the chamber 45 of FIG. 14.

Referring to FIG. 14, an inlet port 47 and a first air curtain 49F may be formed in one surface of the chamber 45. The first air curtain 49F may be formed adjacent to the inlet port 47. The heater 55 may be mounted at one end of the chamber 45.

Referring to FIG. 15, the first air curtain 49F may be aligned over the inlet port 47. The first air curtain 49F may serve to prevent an external air current from flowing through the inlet port 47 into the chamber 45.

Referring to FIG. 16, a plurality of inlet ports 47A may be disposed under the first air curtain 49F.

Figure 17:
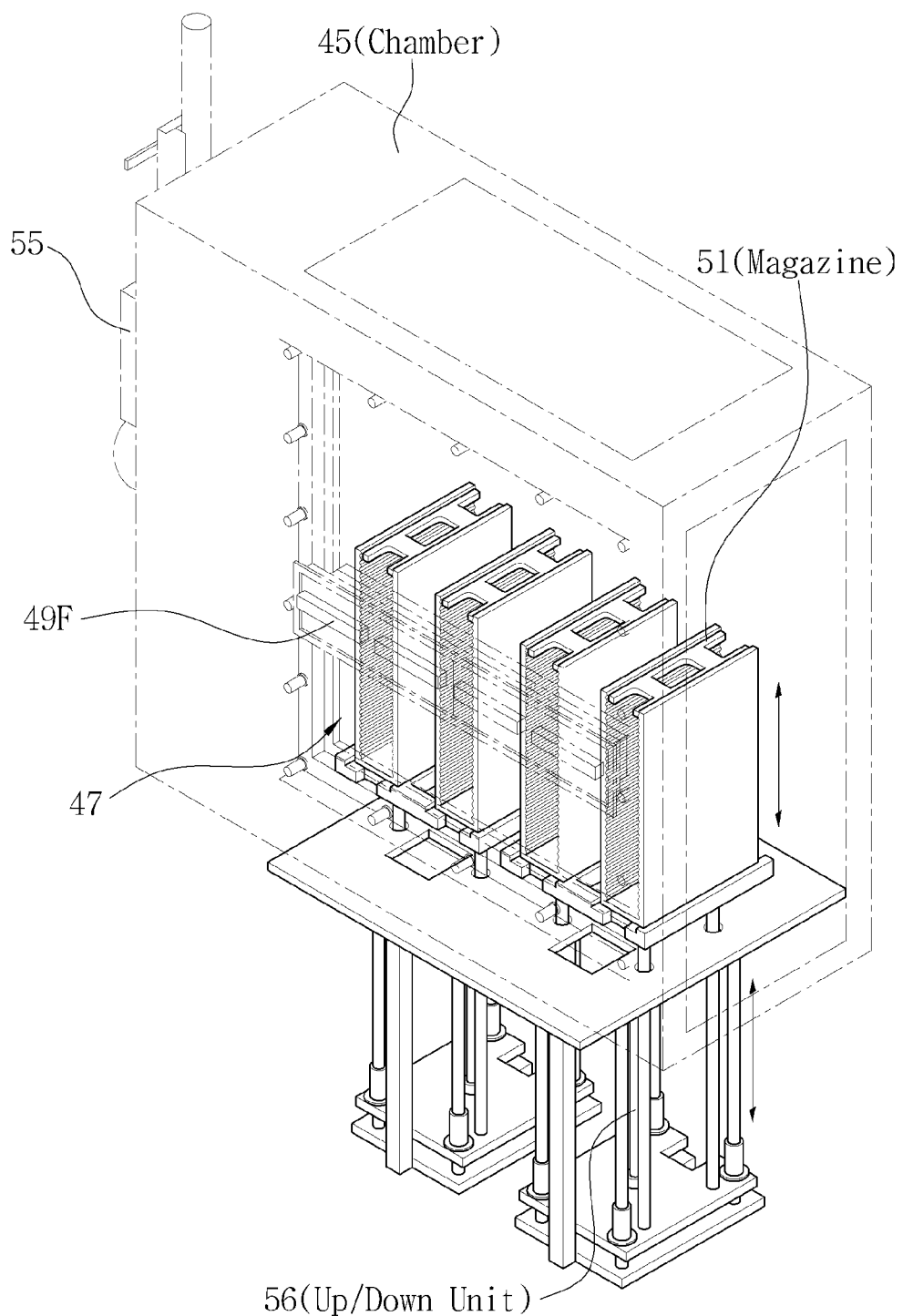
FIG. 17 is a perspective view of magazines of the chamber of FIG. 14.
Figure 18:
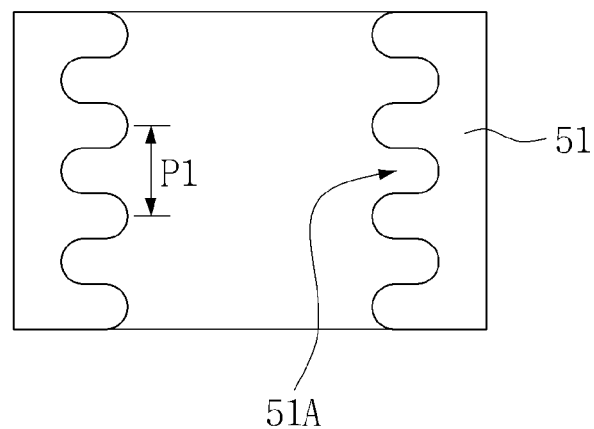
FIG. 18 is an enlarged view of a portion of each of the magazines of FIG. 17.

FIG. 17 is a perspective view of the magazines 51 of the chamber 45 of FIG. 14, and FIG. 18 is an enlarged view of a portion of each of the magazines 51 of FIG. 17.

Referring to FIGS. 17 and 18, the magazines 51 may be mounted in the chamber 45. Each of the magazines 51 may be larger than the inlet port 47. The magazines 51 may be mounted on a second up-down unit up-down unit 56. The second up-down unit 56 may serve to vertically move the magazines 51. Each magazine 51 may include a plurality of loading grooves 51A. The loading grooves 51A may be slits. For example, each of the magazines 51 may include eighty two (82) loading grooves 51A. The loading grooves 51A may be formed to a first pitch P1. The first pitch P1 of the loading grooves 51A may be greater than the first thickness T1 of the push bar 27, see for example, FIGS. 11-13. For example, the first thickness T1 may be equal to about 0.5 times the first pitch P1.

Figure 19:
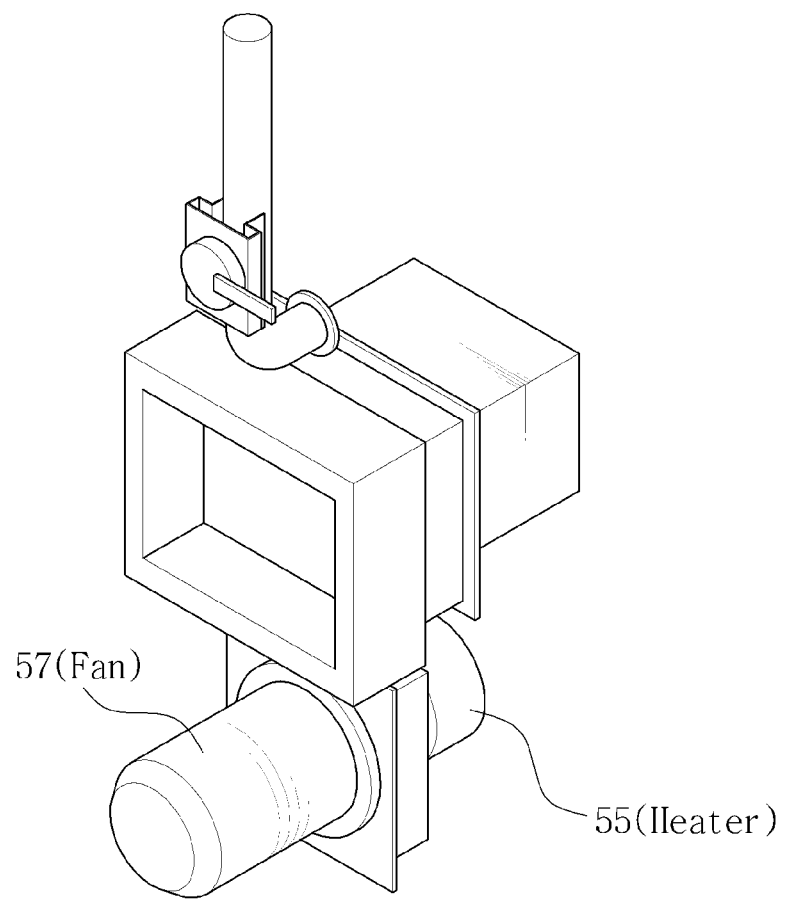
FIG. 19 is a perspective view of a heater mounted in the chamber of FIG. 14.

FIG. 19 is a perspective view of a heater 55 mounted in the chamber 45 of FIG. 14. The heater 55 may be combined with a fan 57. The fan 57 may serve to circulate heat generated by the heater 55 in the chamber 45. An inner temperature of the chamber 45 may be maintained at a temperature of about 100° C. to about 200° C.

Figure 20:
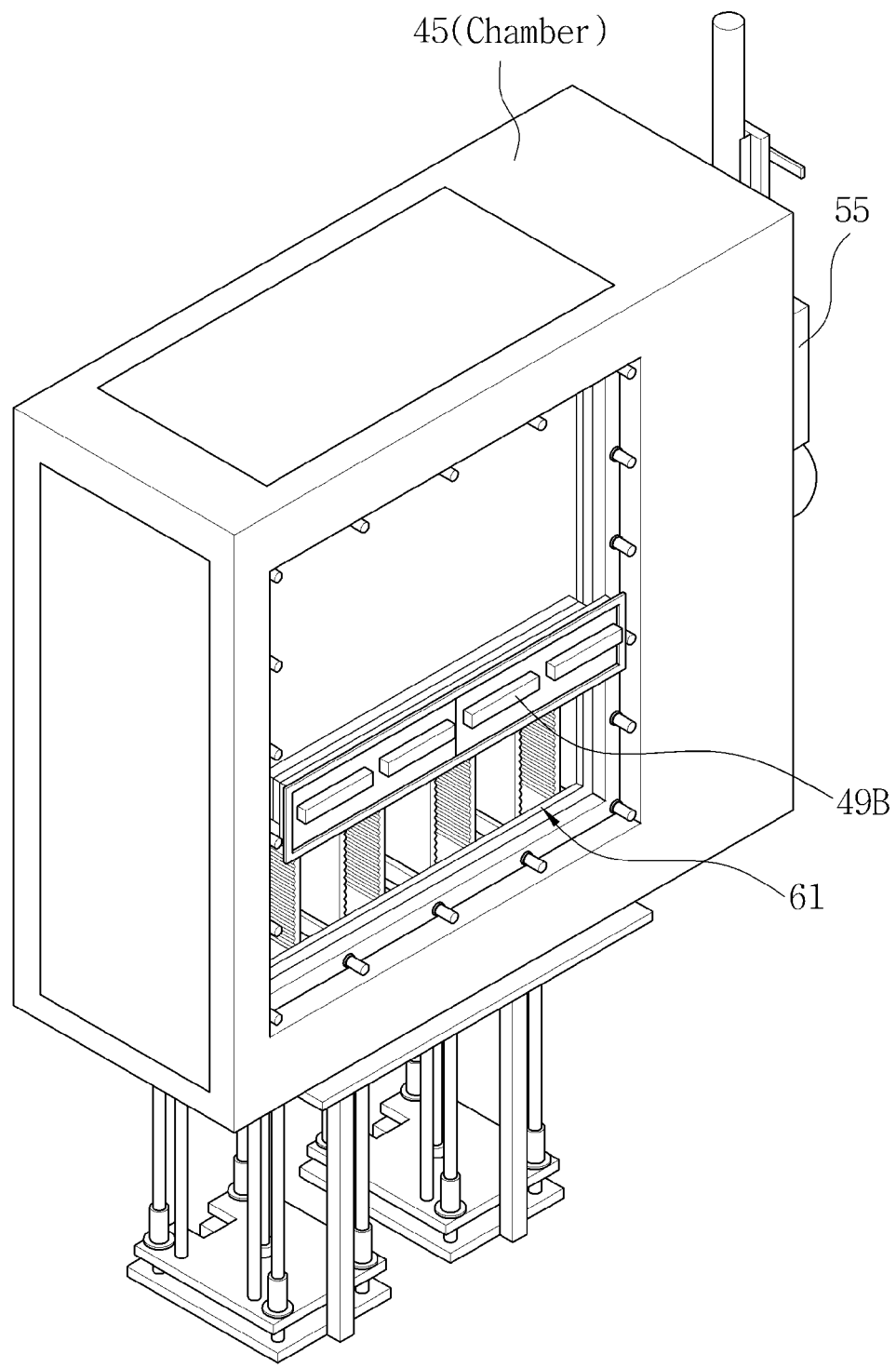
FIGS. 20 and 21 are perspective views of outlet ports of the chamber of FIG. 14.
Figure 21:
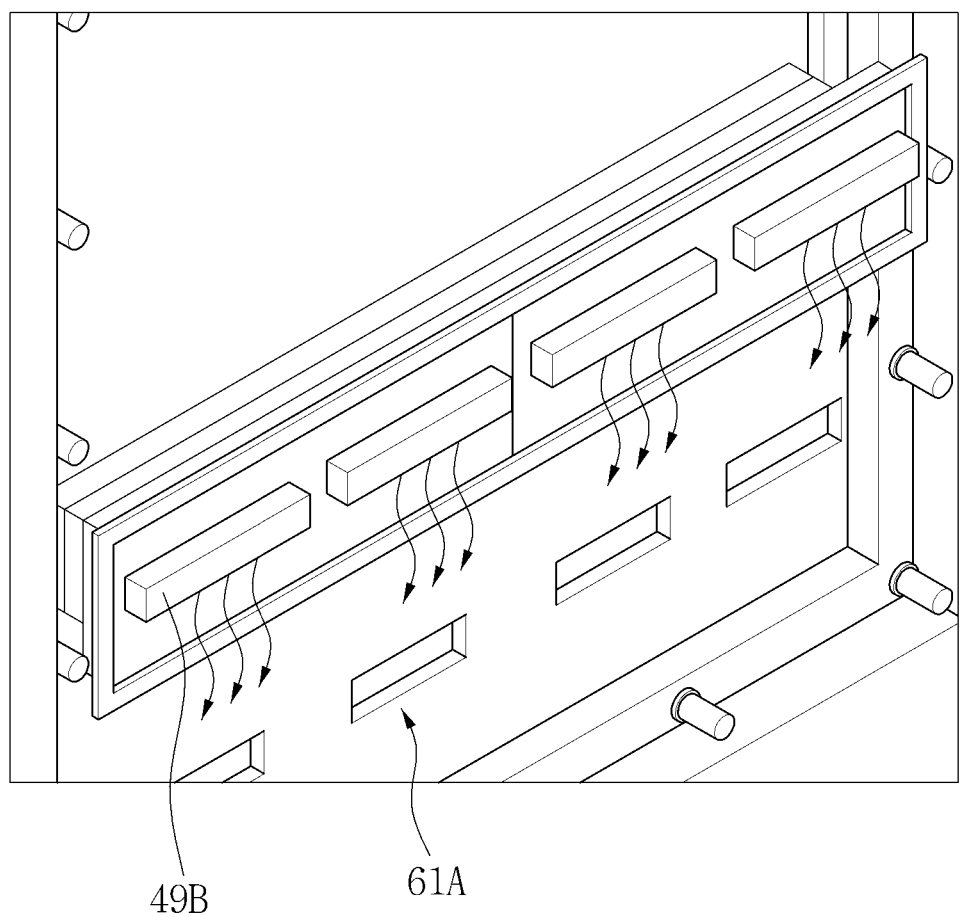

FIGS. 20 and 21 are perspective views of outlet ports of the chamber 45 of FIG. 14.

Referring to FIG. 20, the outlet port 61 and a second air curtain 49B may be formed in another surface of the chamber 45. The second air curtain 49B may be formed adjacent to the outlet port 61. The outlet port 61 may have a smaller size than each of the magazines 51.

Referring to FIG. 21, a plurality of outlet ports 61A may be disposed under the second air curtain 49B.

Figure 22:
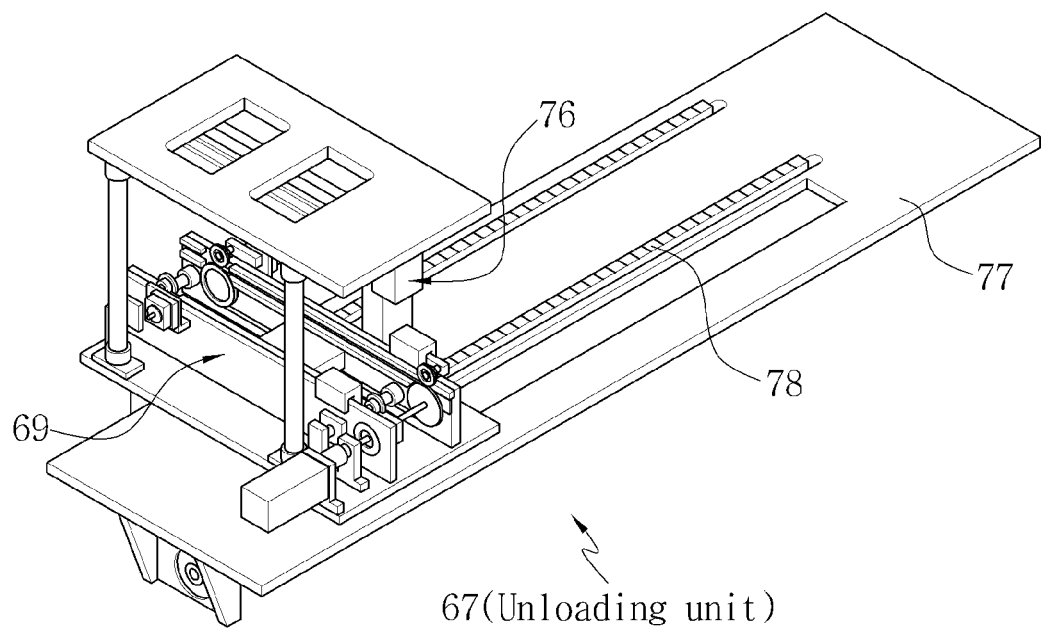
FIG. 22 is a perspective view of an unloading unit of the multi-stack cure system of FIG. 1.
Figure 23:
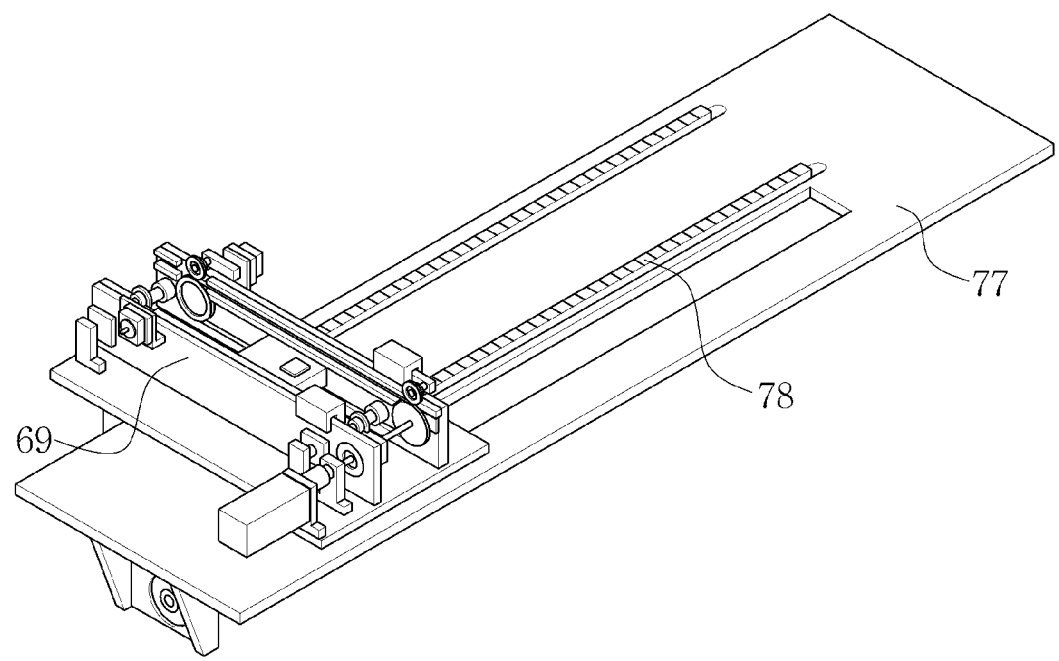
FIG. 23 is a perspective view of the third transfer devices and a horizontal moving rail of the unloading unit of FIG. 22.
Figure 24:
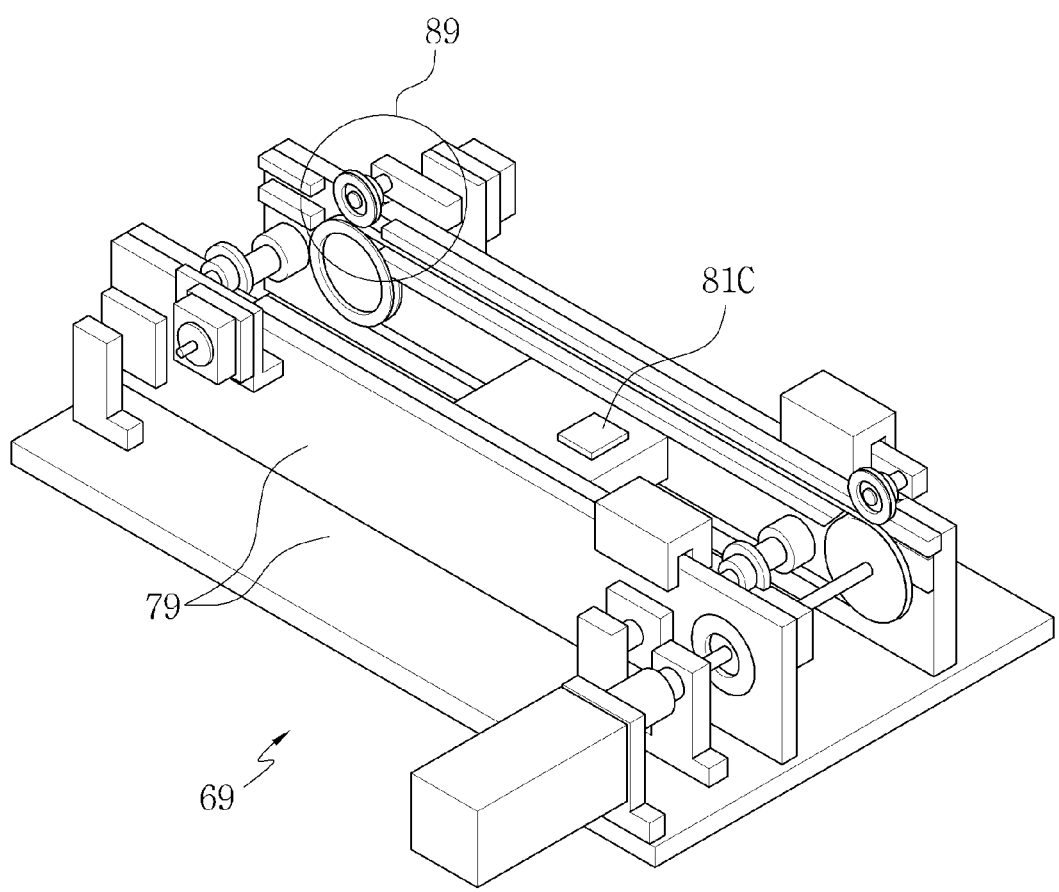
FIG. 24 is a perspective view of the third transfer device of the unloading unit of FIG. 22.

FIG. 22 is a perspective view of an unloading unit 67 of the multi-stack cure system of FIG. 1. FIG. 23 is a perspective view of the third transfer devices 69 and a horizontal moving rail of the unloading unit 67 of FIG. 22. FIG. 24 is a perspective view of the third transfer device 69 of the unloading unit 67 of FIG. 22.

Referring to FIG. 22, the unloading unit 67 may include one or more third transfer devices 69 and a puller 76, which may be mounted on a second plate 77. The third transfer devices 69 may horizontally move along a second rail 78 formed on the second plate 77. The puller 76 may be positioned over the third transfer devices 69.

Referring to FIG. 23, the second rail 78 may be formed on the second plate 77. The third transfer devices 69 may be mounted on the second rail 78. The third transfer devices 69 may be interlocked with the second rail 78 and move in a horizontal direction on the second plate 77.

Referring to FIG. 24, each of the third transfer devices 69 may include a fourth bracket 79 and a plurality of pinch rollers 89 mounted on the fourth bracket 79. The third substrate recognition device 81C may be coupled to the fourth bracket 79. The fourth bracket 79 may be interlocked with the second rail 78 and move in a horizontal direction on the second plate 77.

Figure 25:
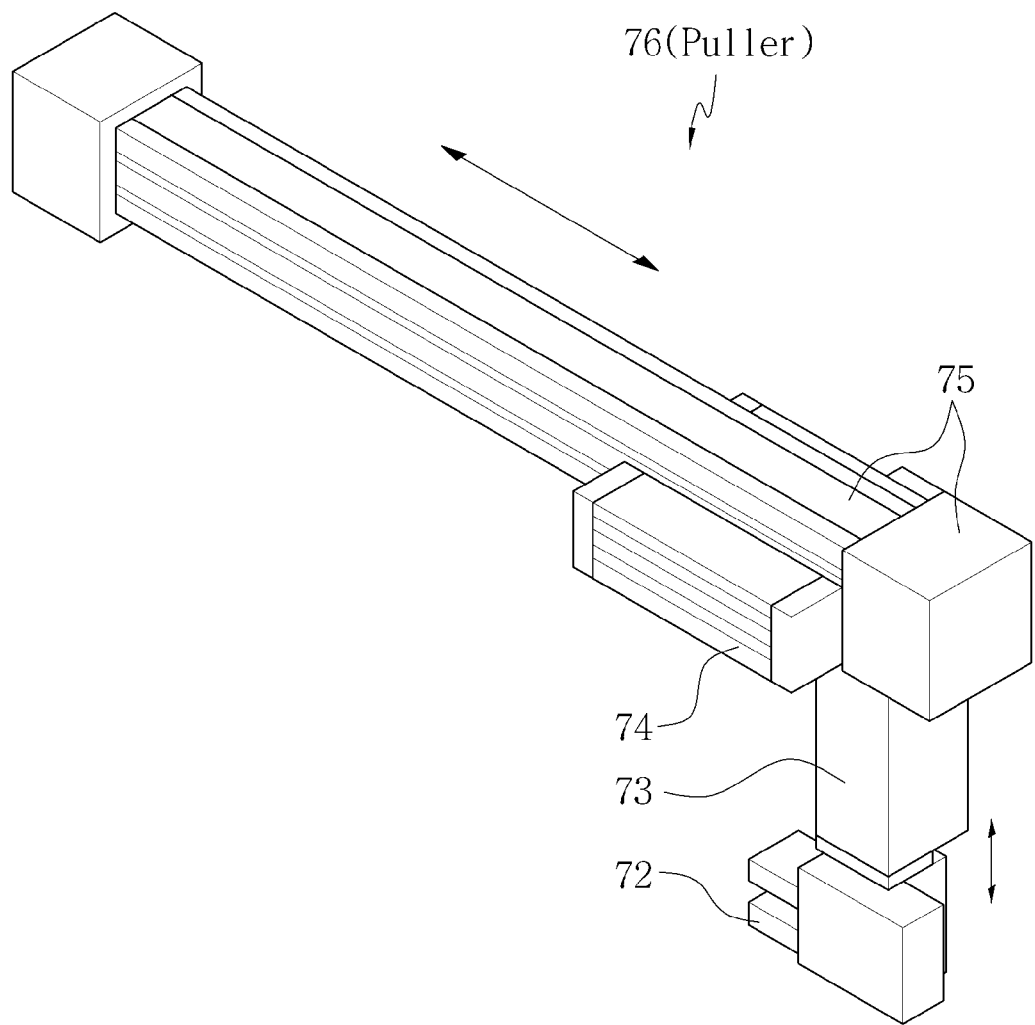
FIGS. 25 and 26 are perspective views of a puller of the unloading unit of FIG. 22.
Figure 26:
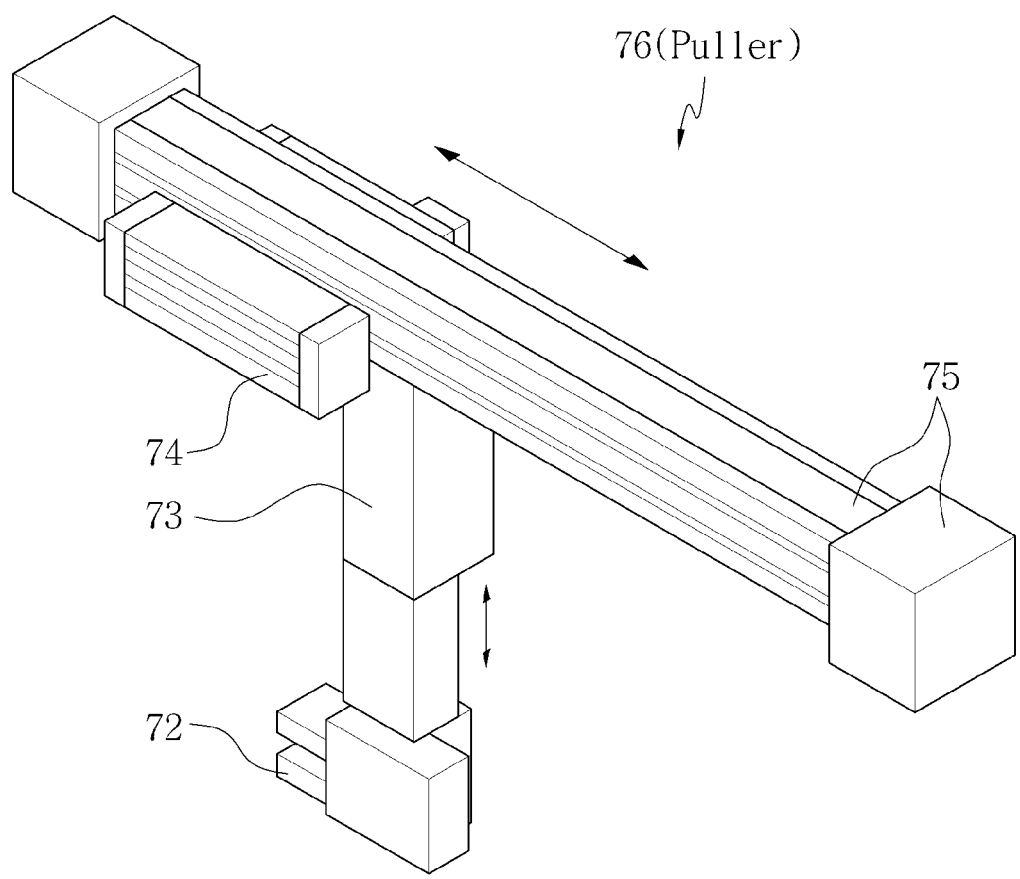

FIGS. 25 and 26 are perspective views of the puller 76 of the unloading unit 67.

Referring to FIGS. 25 and 26, the puller 76 may include a fourth bracket 75, a gripper 72, a third up-down unit 73, and a horizontal moving device 74. The gripper 72 may be mounted on one end of the third up-down unit 73. The gripper 72 may vertically move using the third up-down unit 73. The third up-down unit 73 may be mounted at the horizontal moving device 74. The gripper 72 and the third up-down unit 73 may move in a horizontal direction along the fifth bracket 75 using the horizontal moving device 74.

Figure 27:
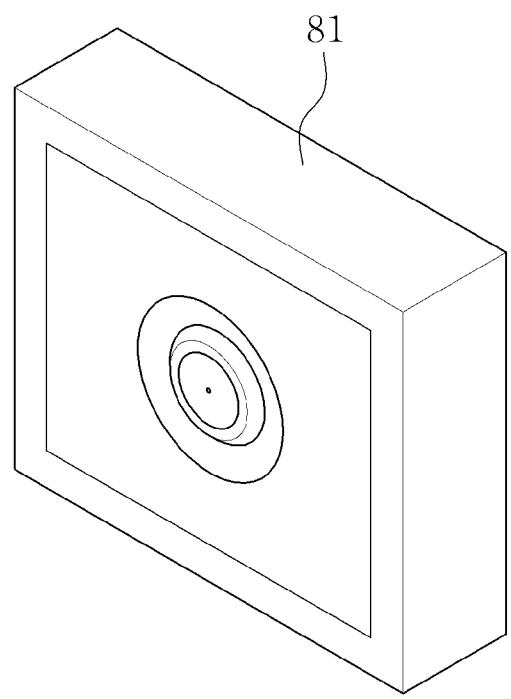
FIG. 27 is a perspective view of a substrate recognition device according to an embodiment of the inventive concepts.

FIG. 27 is a perspective view of a substrate recognition device 81 according to an embodiment of the inventive concepts.

Referring to FIG. 27, the substrate recognition device 81 may be a QR code scanner, a 2D bar code scanner, or a bar code scanner.

Figure 28:
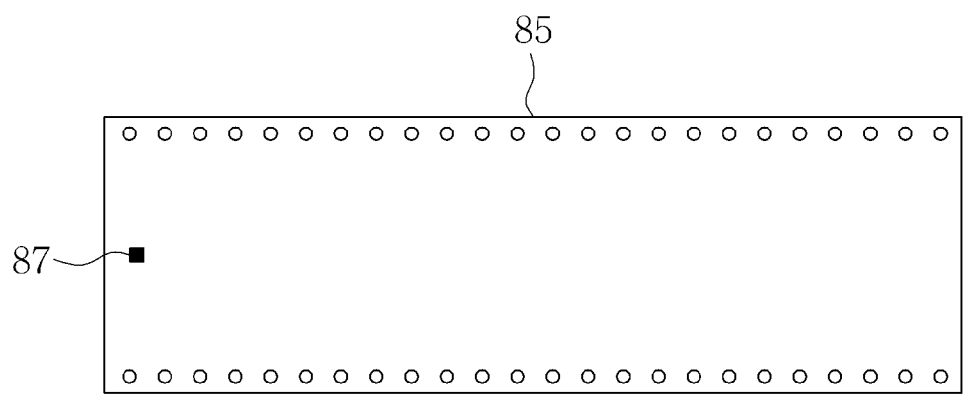
FIG. 28 is a layout of an identification (ID) code formed on one surface of a printed circuit board (PCB) according to an embodiment of the inventive concepts.
Figure 29:
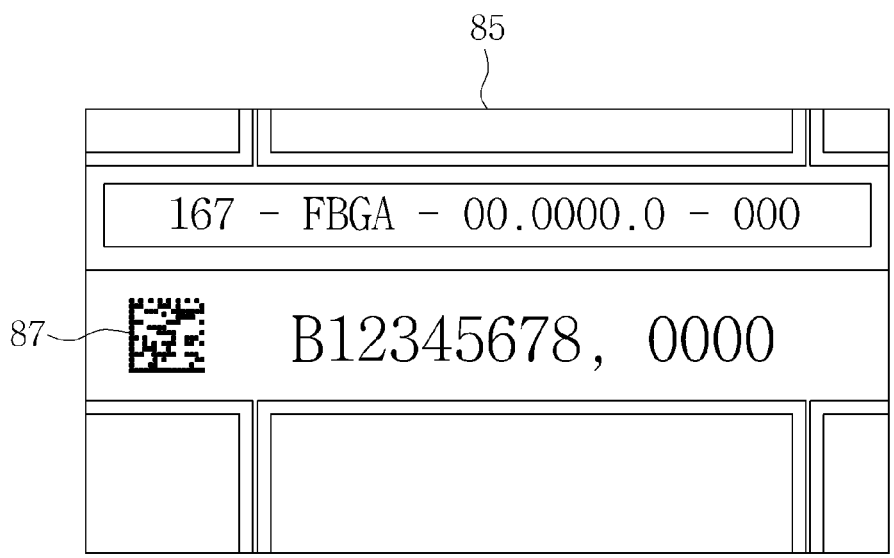
FIG. 29 is a detailed enlarged view of a portion of the PCB of FIG. 28.
Figure 30:
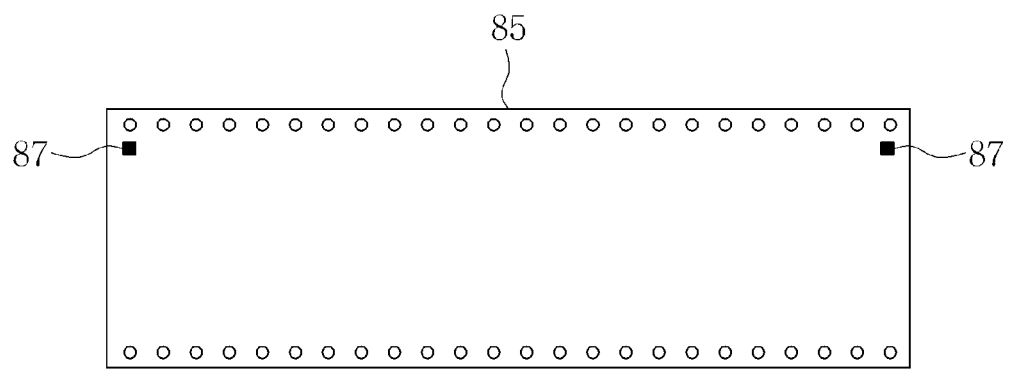
FIG. 30 is a layout of ID codes formed on one surface of a PCB according to another embodiment of the inventive concepts.
Figure 31:
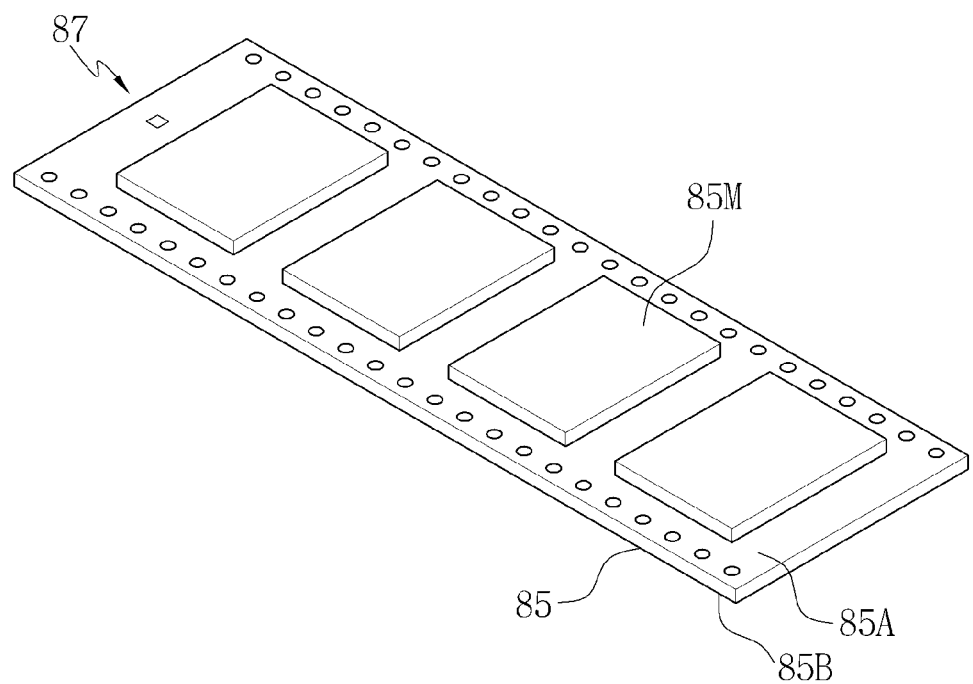
FIG. 31 is a perspective view showing disposition of a PCB, an ID code, and an encapsulant according to an embodiment of the inventive concepts.

FIG. 28 is a layout of an identification (ID) code 87 formed on one surface of a printed circuit board (PCB) 85, according to an embodiment of the inventive concepts. FIG. 29 is a detailed enlarged view of a portion of the PCB 85 of FIG. 28. FIG. 30 is a layout of ID codes formed on one surface of a PCB, according to another embodiment of the inventive concepts. FIG. 31 is a perspective view showing disposition of a PCB, an ID code, and an encapsulant according to an embodiment of the inventive concept.

Referring to FIG. 28, the ID code 87 may be formed on one surface of the PCB 85. The ID code 87 may be disposed in the middle of one side of the PCB 85.

Referring to FIG. 29, the ID code 87 may be a QR code or a 2D bar code. In another embodiment, the ID code 87 may be a bar code.

Referring to FIG. 30, a pair of ID codes 87 may be formed on one surface of the PCB 85. The ID codes 87 may be disposed adjacent to corners of the PCB 85.

Referring to FIG. 31, the PCB 85 may include a first surface 85A and a second surface 85B. An encapsulant 85M may be formed on the first surface 85A of the PCB 85. The encapsulant 85M may include a molding compound formed using an injection molding technique. The ID code 87 may be formed on the second surface 85B of the PCB 85 opposite the first surface 85A.

Figure 32:
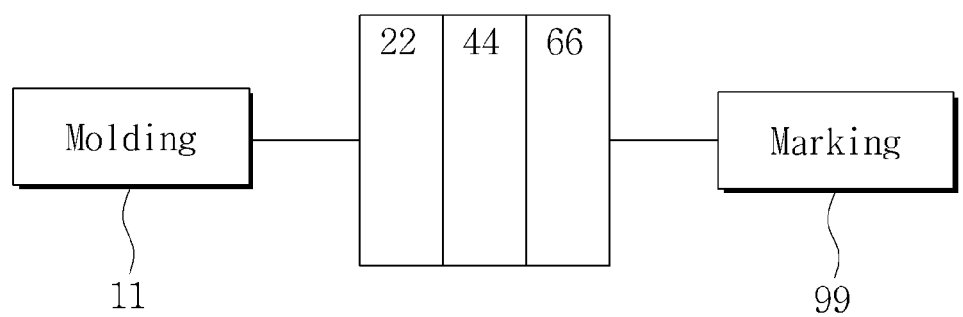
FIG. 32 is a block diagram illustrating configurations of a molding device, multi-stack cure systems, and a marking device according to an embodiment of the inventive concepts.

FIG. 32 is a block diagram illustrating configurations of a molding device 11, multi-stack cure systems 22, 44, and 66, and a marking device 99 according to an embodiment of the inventive concept.

Referring to FIG. 32, multi-stack cure systems 22, 44, and 66 may be disposed between a molding device 11 and a marking device 99. The molding device 11 may form the encapsulant 85M on a PCB 85, for example, shown at FIG. 31. The multi-stack cure systems 22, 44, and 66 may cure the encapsulant 85M formed on the PCB 85. The marking device 99 may write a product ID code on a surface of the encapsulant 85M.

Although another device, for example, a cleaning device or another process, may be added between the multi-stack cure systems 22, 44, and 66 and the marking device 99 according to another embodiment, a detailed description thereof will be omitted for brevity.

Figure 33:
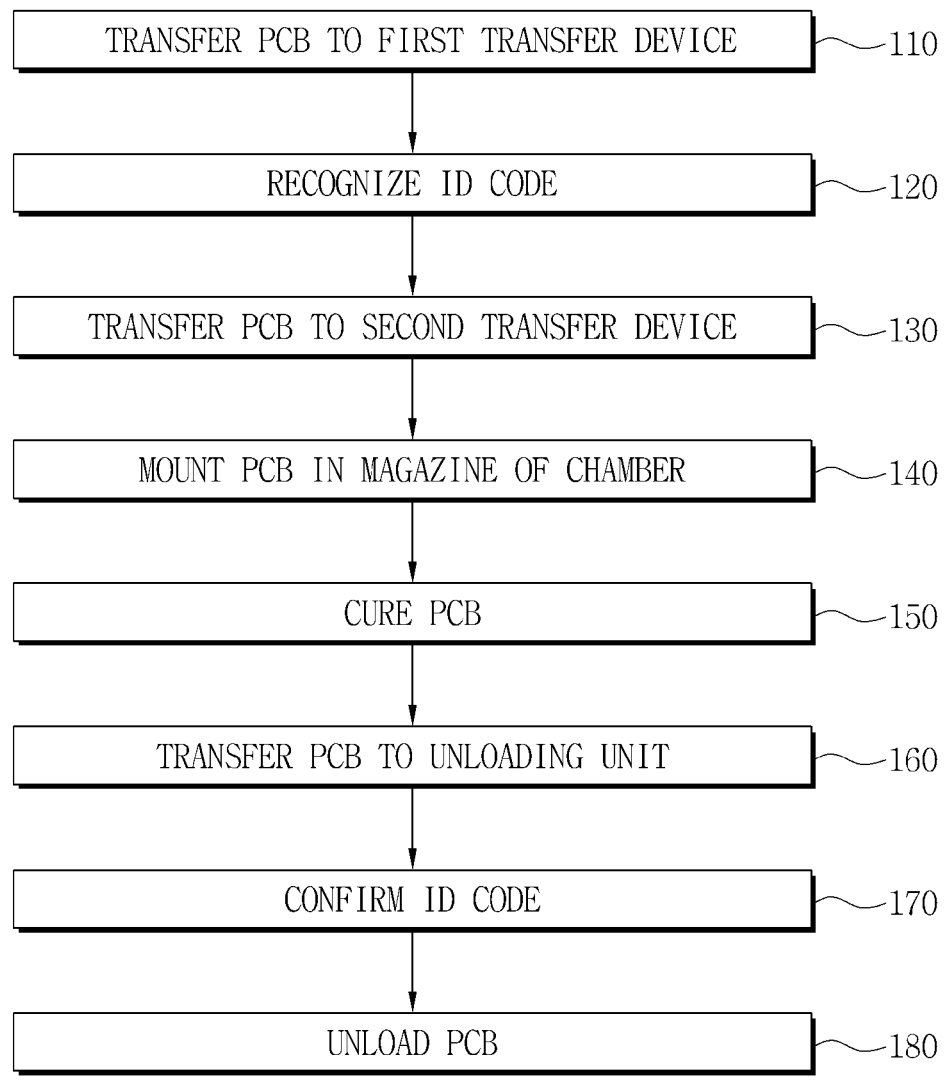
FIG. 33 is a flowchart illustrating a method of operating a multi-stack cure system according to an embodiment of the inventive concepts.

FIG. 33 is a flowchart illustrating a method of operating a multi-stack cure system according to an embodiment of the inventive concept.

Referring to FIG. 33, the method of operating the multi-stack cure system may include transferring at least one PCB having an encapsulant to a first transfer device (operation 110), recognizing an ID code of the PCB (operation 120), transferring the PCB to a second transfer device (operation 130), mounting the PCB in a magazine of a chamber (operation 140), curing the PCB and the encapsulant (operation 150), transferring the PCB to an unloading unit (operation 160), confirming an ID code of the PCB (operation 170), and/or unloading the cured PCB (operation 180).

The PCB 85 having the encapsulant 85M may be transferred to a transfer device selected of the first transfer devices 24 (operation 110). The encapsulant 85M may be formed on one surface of the PCB 85 using the molding device 11. The encapsulant 85M may include a molding compound. A plurality of semiconductor chips may be mounted on the PCB 85. The semiconductor chips may be electrically connected to the PCB 85 using conductive connection elements, such as bonding wires. The encapsulant 85M may cover the semiconductor chips and the conductive connection elements. The ID code 87 may be exposed on one surface of the PCB 85. The ID code 87 may be a QR code or a 2D bar code. One or more PCBs 85 having the encapsulant 85M may be transferred, piece by piece, to one selected out of the first transfer devices 24 with no required standby time.

The ID code 87 of the PCB 85 may be recognized by one selected out of the first and second substrate recognition devices 81A and 81B (operation 120). Information regarding the ID code 87 may be transferred to the control device 93. A cure limit time of the encapsulant 85M may be determined based on the ID code 87. For example, the cure limit time of the encapsulant 85M may be 0.5 hour, 1 hour, or 2 hours, or greater. The cure limit time may be interpreted as the cure limit time of the encapsulant 85M.

The PCB 85 may be transferred to one selected out of the second transfer devices 25 by the pinch rollers 89 (operation 130). One selected out of the second transfer devices 25 may be interlocked with the first rail 35 and horizontally move on the first plate 34. The PCB 85 may be aligned with the corresponding one of the inlet ports 47A.

The magazines 51 of the chamber 45 may be aligned with the inlet ports 47A. The second up-down unit 56 may vertically move the magazines 51. One selected out of the loading grooves 51A may be aligned with the corresponding one of the inlet ports 47A by the second up-down unit 56. The PCB 85 having the encapsulant 85M may be mounted in one selected out of the loading grooves 51A using the push bar 27 (operation 140). During the loading of the PCB 85, the first air curtain 49F may prevent an external air current from flowing into the chamber 45. Each of the inlet ports 47A may have dimensions such as width, length, shape, area, and the like that are greater than those of the PCB 85 having the encapsulant 85M, and smaller dimensions than those of the magazines 51. For instance, each of the inlet ports 47A may have such a minimum size that the PCB 85 having the encapsulant 85M may pass through each of the inlet ports 47A. The first thickness T1 of the push bar 27 may be smaller than the first pitch P1 of the loading grooves 51A. The push bar 27 may be smaller than the inlet ports 47A. The push bar 27 may pass through the inlet ports 47A.

The PCB 85 having the encapsulant 85M may be cured for the cure limit time in the chamber 45 (operation 150). An inner temperature of the chamber 45 may be maintained constant by the heater 55. Each of the magazines 51 may include a plurality of loading grooves 51A. For instance, each of the magazines 51 may include 82 loading grooves 51A. A plurality of PCBs 85 may be loaded in each of the magazines 51. For example, PCBs 85 having encapsulants 85M requiring different cure limit times may be mixedly loaded in each of the magazines 51.

The PCB 85 having the encapsulant 85M whose cure limit time has elapsed may be aligned with the corresponding one of the outlet ports 61A by the second up-down unit 56. The third transfer devices 69 and the puller 76 may be interlocked with the second rail 78 and aligned with the corresponding one of the outlet ports 61A. The gripper 72 may have such a size as to grip the PCB 85 having the encapsulant 85M. The PCB 85 may pass one selected out of the outlet ports 61A due to the push bar 27 and gripped by the gripper 72. The PCB 85 gripped by the gripper 72 may transferred onto the third transfer devices 69 due to an operation of the puller 76 (operation 160). Each of the outlet ports 61A may be larger than the PCB 85 having the encapsulant 85M and smaller than the magazines 51. For instance, each of the outlet ports 61A may have such a minimum size that the PCB 85 having the encapsulant 85M may pass through each of the outlet ports 61A. During the unloading of the PCB 85, the second air curtain 49B may prevent an external air current from flowing into the chamber 45. The PCBs 85 having the encapsulant 85M whose cure limit times have elapsed may be unloaded piece by piece in sequential order.

The ID code 87 of the PCB 85 may be confirmed by the third substrate recognition device 81C (operation 170). Information regarding the ID code 87 may be transmitted to and confirmed via the control device 93.

The cured PCB 85 having the encapsulant 85M may be unloaded and transferred by the pinch rollers 89 for subsequent processes (operation 180).

According to embodiments of the inventive concept as described above, the PCB 85 having the encapsulant 85M may be transferred and mounted in the magazines 51 of the chamber 45. The PCB 85 may not need to stand by between the molding device 11 and the multi-stack cure systems 22, 44, and 66 during a process. The PCB 85 having a cure limit time has elapsed may be unloaded from the chamber 45 and transferred for subsequent processes. Accordingly, products having different cure limit times may be loaded in the magazines 51. The multi-stack cure system 22, 44, and 66 may be greatly downscaled as compared with the conventional case.

Accordingly, embodiments of the inventive concepts can provide a multi-stack cure system capable of loading PCBs having encapsulants, one by one, in a magazine of a chamber and curing the PCBs having the encapsulants, regardless of required curing times of the PCBs. One feature is that a standby time between a process of forming the encapsulant and a process performed in the multi-stack cure system can be greatly reduced as compared with conventional systems. Another feature is that products having different cure limit times can be mixedly loaded in the magazine of the chamber. Also, products such as PCBs whose cure limit times have elapsed can be unloaded piece by piece in sequential order and transferred for subsequent processes. The size of the multi-stack cure system can therefore be greatly reduced as compared with the conventional case. Therefore, a multi-stack cure system capable of effectively utilizing space and maximizing mass productivity can be embodied.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A multi-stack cure system comprising:
a chamber having an inlet port and an outlet port;
a magazine in the chamber, wherein a plurality of substrates having encapsulants is loaded into the magazine;

a heater mounted at the chamber, the heater constructed and arranged to heat the plurality of substrates having the encapsulants;
a loading unit adjacent to the inlet port and having a transfer device and a push bar;
a substrate recognition device at the loading unit; and
a control device coupled to the substrate recognition device, wherein the inlet port has a size that is larger than each of the plurality of substrates having the encapsulants and smaller than the magazine.

2. The system of claim 1, wherein the magazine includes a plurality of loading grooves constructed and arranged to load the plurality of substrates having the encapsulants, wherein a thickness of the push bar is smaller than a pitch of the loading grooves.

3. The system of claim 1, wherein the loading unit further comprises:
a plate; and
a rail formed on the plate, wherein the transfer device comprises:
a first transfer device coupled to the plate; and
a second transfer device between the first transfer device and the inlet port and configured to horizontally move along the rail.

4. The system of claim 3, wherein the substrate recognition device is mounted on the first transfer device.

5. The system of claim 3, wherein each of the first and second transfer devices includes a plurality of pinch rollers constructed and arranged to transfer one substrate of the plurality of substrates having the encapsulants at a time.

6. The system of claim 1, wherein the substrate recognition device includes a quick response (QR) code scanner, a 2-dimensional (2D) bar code scanner, or a bar code scanner.

7. The system of claim 1, wherein each of the plurality of substrates having the encapsulants includes an identification (ID) code, wherein the ID code is a QR code, a 2D bar code, or a bar code.

8. The system of claim 1, further comprising an unloading unit adjacent the outlet port and having a third transfer device and a puller.

9. The system of claim 8, wherein the puller includes a gripper having a size permitting the gripper to grip one selected of the plurality of substrates having the encapsulants.

10. A multi-stack cure system comprising:
a chamber having an inlet port and an outlet port;
a magazine in the chamber, wherein a plurality of substrates having encapsulants is loaded into the magazine;
a heater mounted at the chamber, the heater constructed and arranged to heat the plurality of substrates having the encapsulants;
an unloading unit adjacent the outlet port and having a transfer device and a gripper;
a substrate recognition device at the unloading unit; and
a control device coupled to the substrate recognition device,
wherein the outlet port has a size that is larger than each of the plurality of substrates having the encapsulants and smaller than the magazine.

11. The system of claim 10, wherein the gripper has such a size permitting the gripper to grip one selected of the plurality of substrates having the encapsulants.

12. The system of claim 10, wherein the unloading unit further comprises:
a plate; and
a rail formed on the plate, wherein the transfer device moves horizontally along the rail.

13. The system of claim 12, wherein the transfer device of the unloading unit includes a plurality of pinch rollers constructed and arranged to transfer one substrate of the plurality of substrates having the encapsulants at a time.

14. The system of claim 10, further comprising a loading unit adjacent the inlet port and having a second transfer device and a pusher.

15. The system of claim 14, wherein the pusher includes a push bar configured to push one substrate of the plurality of substrates having the encapsulants at a time.

16. A multi-stack cure system comprising:
a loading zone;
an unloading zone;
a cure zone including a chamber, the chamber having a plurality of inlet ports and a plurality of outlet ports; and
a magazine positioned in the chamber, the magazine constructed and arranged to receive a plurality of substrates having encapsulants transferred from the loading zone to the chamber via the inlet ports, the encapsulants of the substrates having different cure limit times, wherein a substrate of the plurality of substrates has an encapsulant having an elapsed cure time, and wherein the substrate is aligned with an outlet port of the plurality of outlet ports for output to the unloading zone.

17. The system of claim 16, wherein the inlet ports and the outlet ports have a dimension that is greater than the plurality of substrates having the encapsulants and smaller than the magazine.

18. The system of claim 16, further comprising a heater at the chamber, the heater constructed and arranged to heat the plurality of substrates having the encapsulants.

19. The system of claim 16, wherein the loading zone includes a loading unit, the loading unit having a transfer device and a push bar, wherein the magazine includes a plurality of loading grooves constructed and arranged to load the plurality of substrates, and wherein a thickness of the push bar is smaller than a pitch of the loading grooves.

20. The system of claim 16, further comprising a substrate recognition device at the loading unit, wherein the substrate recognition device includes a quick response (QR) code scanner, a 2-dimensional (2D) bar code scanner, or a bar code scanner, wherein each of the plurality of substrates includes an identification (ID) code, and wherein the ID code is a QR code, a 2D bar code, or a bar code.

* * * * *